(12) United States Patent
Nishinaga

(10) Patent No.: US 6,927,836 B2
(45) Date of Patent: Aug. 9, 2005

(54) EXPOSURE APPARATUS AND EXPOSURE METHOD CAPABLE OF CONTROLLING ILLUMINATION DISTRIBUTION

(75) Inventor: Hisashi Nishinaga, Urawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/876,712

(22) Filed: Jun. 28, 2004

(65) Prior Publication Data

US 2004/0239904 A1 Dec. 2, 2004

Related U.S. Application Data

(62) Division of application No. 09/790,616, filed on Feb. 23, 2001, now Pat. No. 6,771,350.

(30) Foreign Application Priority Data

| Feb. 25, 2000 | (JP) | ................................. | 2000-049740 |
| Jul. 19, 2000 | (JP) | ................................. | 2000-218547 |
| Feb. 15, 2001 | (JP) | ................................. | 2001-038326 |
| Feb. 16, 2001 | (JP) | ................................. | 2001-039758 |

(51) Int. Cl.[7] ............................................. G03B 27/42
(52) U.S. Cl. ........................ 355/53; 355/67; 355/69; 355/71
(58) Field of Search ........................ 355/53, 67–69, 355/71; 250/548

(56) References Cited

U.S. PATENT DOCUMENTS

| 4,598,197 | A | 7/1986 | Morita et al. |
| 5,305,054 | A | 4/1994 | Suzuki et al. |
| 5,486,896 | A | 1/1996 | Hazama et al. |
| 5,499,100 | A | 3/1996 | Tanaka |
| 5,581,075 | A | 12/1996 | Naraki et al. |
| 5,615,047 | A | 3/1997 | Komatsuda et al. |
| 5,684,566 | A | 11/1997 | Stanton |
| 5,719,704 | A | 2/1998 | Shiraishi et al. |
| 5,841,520 | A | 11/1998 | Taniguchi |
| 5,867,319 | A | 2/1999 | Sugiyama et al. |
| 6,051,842 | A | 4/2000 | Yamamoto |
| 6,127,095 | A | 10/2000 | Kudo |
| 6,211,944 | B1 | 4/2001 | Shiraishi |
| 6,259,512 | B1 | 7/2001 | Mizouchi |
| 6,281,967 | B1 | 8/2001 | Kudo |
| 6,333,777 | B1 | 12/2001 | Sato |
| 6,404,499 | B1 | 6/2002 | Stoeldraijer et al. |
| 6,535,274 | B2 | 3/2003 | Antoni |
| 6,583,855 | B2 | 6/2003 | Krikke et al. |
| 6,607,863 | B2 | 8/2003 | Irie |
| 6,704,090 | B2 | 3/2004 | Nishi |
| 2001/0010579 | A1 | 8/2001 | Nishi |
| 2004/0032576 | A1 | 2/2004 | Kondo |

FOREIGN PATENT DOCUMENTS

| EP | 0 869 396 A2 | 10/1998 |
| EP | 0 952 491 A3 | 10/1999 |
| JP | A-59-83165 | 5/1984 |
| JP | A-61-190935 | 8/1986 |
| JP | A-6-124875 | 5/1994 |
| JP | B2-7-85140 | 9/1995 |
| JP | A-10-27752 | 1/1998 |
| JP | A-10-199800 | 7/1998 |
| JP | A-11-317349 | 11/1999 |

*Primary Examiner*—D. Rutledge
(74) *Attorney, Agent, or Firm*—Oliff & Berridge PLC

(57) ABSTRACT

An exposure apparatus which expose a photosensitive layer on an object with light via a mask having a pattern to be transferred onto the photosensitive layer, includes an illumination optical system having plural optical elements provided along an optical axis substantially perpendicular to a plane on which the pattern is placed, and which include an optical integrator from which the mask is illuminated with the light through a part of the plural optical elements. The apparatus also includes a filter device having a rotatable filter element provided between the optical integrator and the plane, and having a transmittance distribution in a predetermined area. Light from the optical integrator passes through a portion in the predetermined area. Light from the filter element has a variable intensity distribution different from that of the light incident on the filter element from the optical integrator, and made variable by rotating the filter element.

16 Claims, 14 Drawing Sheets

Fig. 6A
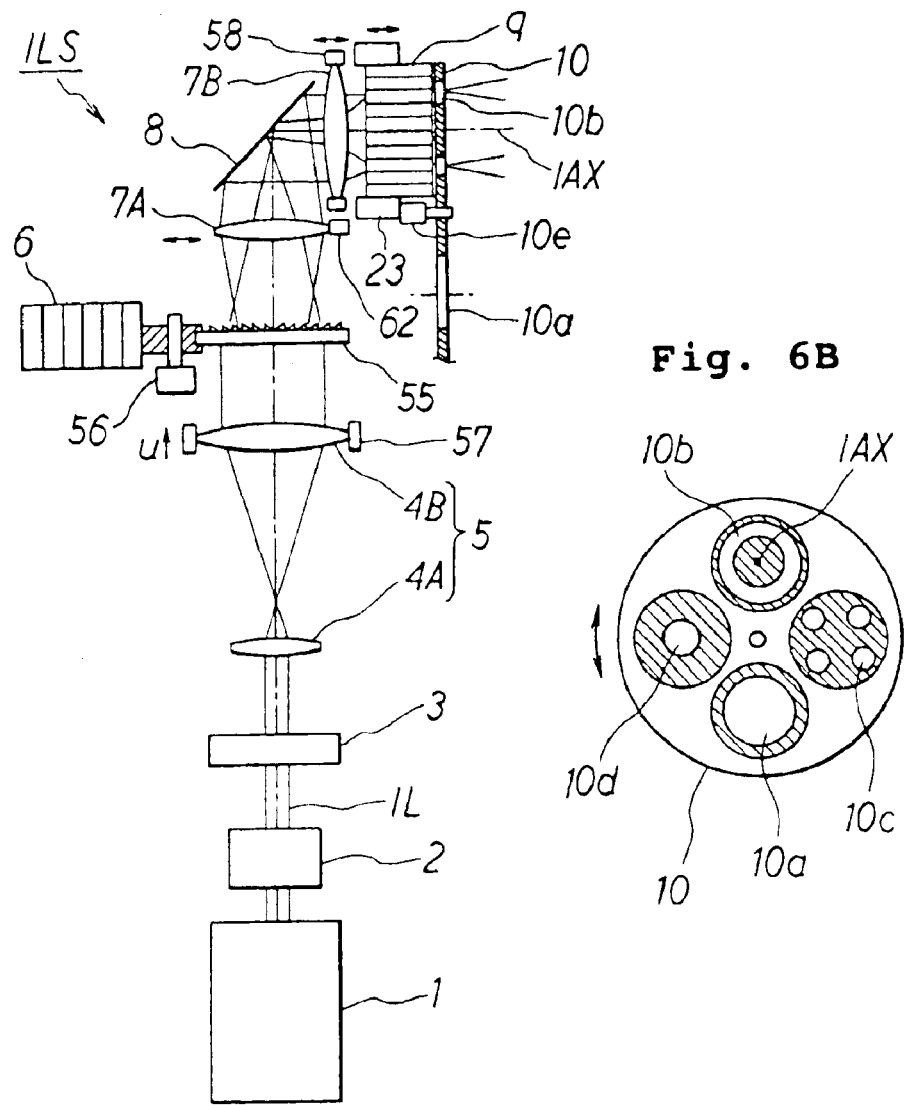
Fig. 6B
Fig. 7
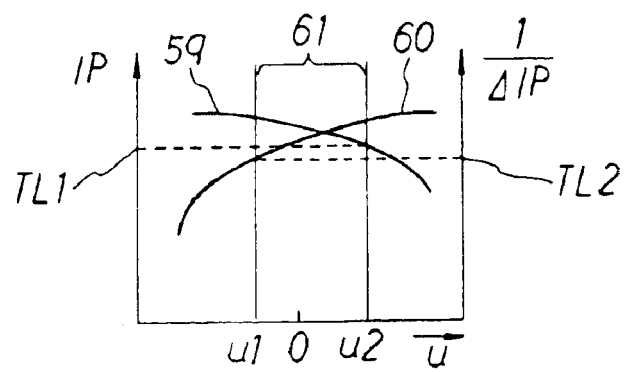

Fig. 15A  Fig. 15B  Fig. 15C
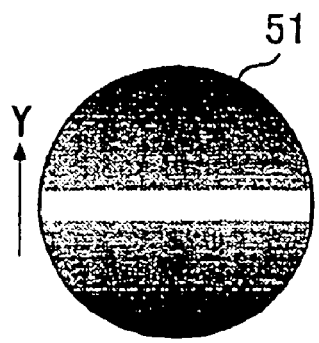
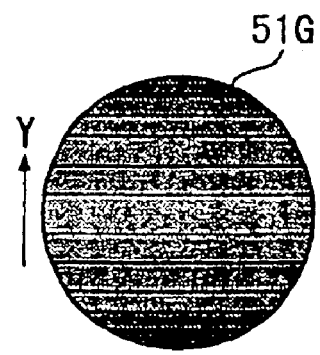
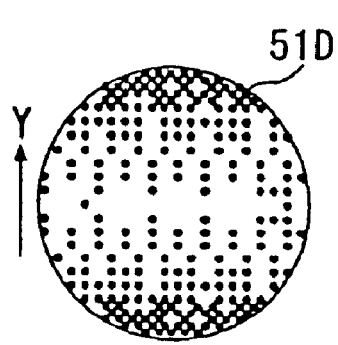
Fig. 16
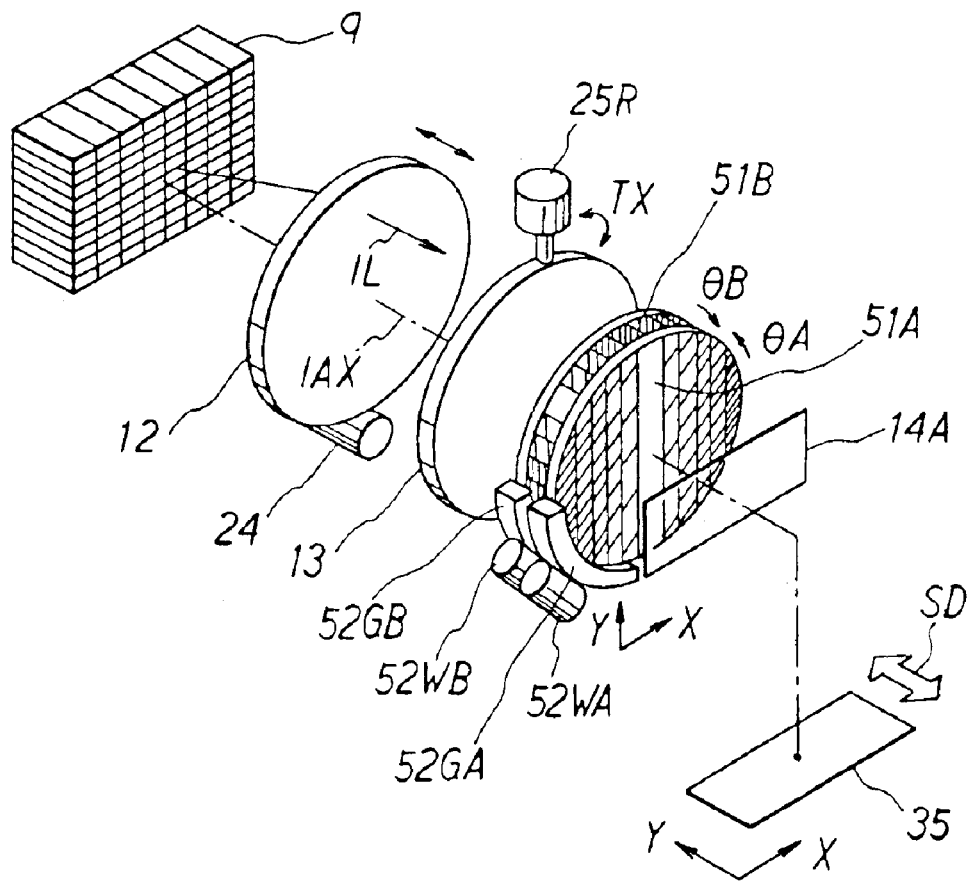

EXPOSURE APPARATUS AND EXPOSURE METHOD CAPABLE OF CONTROLLING ILLUMINATION DISTRIBUTION

This is a Division of application Ser. No. 09/790,616 filed Feb. 23, 2001 now U.S. Pat. No. 6,771,350. The entire disclosure of the prior application is hereby incorporated by reference herein in its entirety.

BACKGROUND OF THE INVENTION

1. Field of the Invention

The present invention relates to an exposure apparatus and an exposure method to be used in order to transfer a mask pattern onto a substrate through a projection optical system in the lithography step for producing, for example, semiconductor elements, liquid crystal displacement elements, plasma display elements, or thin film magnetic heads. In particular, the present invention relates to an exposure apparatus and an exposure method capable of controlling the distribution of illumination generated by an illumination system automatically or precisely.

2. Description of the Related Art

In order to respond to the improvement in the degree of integration and the degree of fineness of the semiconductor device, the exposure apparatus, which is in charge of the lithography step (representatively including the resist application step, the exposure step, and the resist development step) for producing the semiconductor device, is required to further enhance, for example, the resolving power and the transfer faithfulness. In order to enhance the resolving power and the transfer faithfulness as described above, it is necessary that the wavelength of the exposure light beam as the exposure beam is shortened, the projection optical system having a large numerical aperture is used, and the exposure amount is controlled highly accurately in order to expose, with a proper exposure amount, the photoresist applied on the wafer as the substrate. In order to extract the image formation characteristic of the projection optical system to the limit so that the exposure amount is controlled for the photoresist highly accurately, it is necessary to optimize the illumination optical system so as to enhance the illumination characteristic of the illumination optical system for illuminating the reticle as the mask with the exposure light beam as far as possible.

The adjustment to optimize the illumination optical system of the exposure apparatus has been hitherto performed in accordance with the following steps.

(a) An operator measures the illumination characteristic (for example, uneven illuminance) of an adjustment objective of the illumination optical system.

(b) The state (for example, position or angle of inclination) of a predetermined optical member is adjusted by using a driving unit corresponding to the illumination characteristic on the basis of the obtained result of the measurement. The driving amount concerning this process is set so that the illumination characteristic is improved as far as possible by correcting the optical design value on the basis of the experience of the operator.

(c) After the adjustment, the remaining amount of the illumination characteristic is measured again. If the remaining amount exceeds an allowable range, the adjustment is performed again by the aid of the driving unit.

(d) After the completion of the adjustment, the final state (optimum state) of the optical member is stored.

The adjustment steps as described above are repeated for every illumination characteristic of the adjustment objective for each of a plurality of illumination conditions to store the optimum state of the corresponding optical member. When the illumination condition is switched, the corresponding optical member is set to be in the optimum state respectively.

As described above, the adjustment for optimizing the illumination optical system of the conventional exposure apparatus has been performed by the operator, for example, when the exposure apparatus is assembled and adjusted and when the maintenance is performed.

However, when the operator performs the adjustment, an inconvenience arises such that a long period of time is required to perform the adjustment. Further, it is necessary to adjust the illumination optical system for each of the plurality of illumination conditions. Therefore, the overall adjustment time is fairly prolonged. The time required for the optimization is also affected by the degree of skill of the operator. Therefore, there has been also such a fear that the adjustment time is further prolonged depending on the operator.

When the states of a plurality of optical members in the illumination optical system are required to be adjusted, it is necessary to consider, for example, the mutual influence caused by the adjustment as well. Therefore, the adjustment steps have been extremely complicated.

As described above, the adjustment for the conventional illumination optical system has required the complicated steps which take a long period of time. Therefore, for example, it has been difficult to perform such an operation that the allowable level of a predetermined illumination characteristic is changed depending on, for example, the required accuracy for the device to be produced. Further, for example, the uneven illuminance of the illumination characteristic is changed in a time-dependent manner, for example, due to the cloudiness of the optical member in the illumination optical system and the deterioration of the saltpeter material in some cases. However, in such a case, it has been difficult for the conventional adjustment method to make quick response.

The uneven illuminance is principally divided into the uneven illuminance which is axially symmetrical with respect to the optical axis (centro-symmetrical unevenness), i.e., the quadratic function-like unevenness, and the inclination unevenness in which the illuminance is gradually increased or decreased in the area across the optical axis, i.e., the linear function-like unevenness. It is necessary that the uneven illuminance as described above is corrected highly accurately in the orthogonal two directions in the case of the full field exposure type exposure apparatus such as the stepper. On the other hand, in the case of the scanning exposure type exposure apparatus such as those based on the step-and-scan system, the uneven illuminance in the scanning direction is averaged by the scanning exposure operation to such an extent that little problem occurs. Therefore, it is required to especially correct the uneven illuminance in the non-scanning direction perpendicular to the scanning direction highly accurately.

The uneven illuminance has been hitherto corrected in ordinary cases by driving a group of predetermined lenses in the illumination optical system in the optical axis direction, or by driving the group of lenses so that the tilt angle about the two axes is changed. In general, the situation of the uneven illuminance differs depending on the illumination condition. Especially, in the case of the centro-symmetrical unevenness, the degree of concaveness/convexness of the illuminance is changed corresponding to the change of the position through which the light flux passes in the lens group depending on the numerical aperture of the exposure light beam (illumination light beam). Therefore, for example, as for the lens group as the adjustment objective, the optimum position is previously stored for each of the illumination conditions, and the lens group is driven to the optimum position every time when the illumination condition is changed.

A phenomenon is known, in which the cloudy substance adheres to the surface of the optical element when the exposure light beam in the ultraviolet region reacts with a minute amount of organic matter contained in the gas existing around the optical element. Usually, the gas, from which the organic matter or the like is removed, for example, through a chemical filter, is supplied to the surroundings of the respective lenses of the illumination optical system and the projection optical system. However, when the exposure apparatus is used for a long period of time, then a slight amount of remaining organic matter gradually increases the cloudiness of the lens, and the centro-symmetrical unevenness, in which the illuminance is lowered especially at the central portion, is sometimes advanced in a time-dependent manner. In such a case, the operator has adjusted the position of the corresponding lens group again, depending on the degree of advance of the centro-symmetrical unevenness. Further, for example, when the centro-symmetrical unevenness is extremely advanced during the process of the use of the exposure apparatus for several years, the lens group as the adjustment objective itself is exchanged with a lens group having a strong effect of correction in some cases.

As described above, the uneven illuminance of the conventional exposure apparatus has been corrected by controlling the tilt angle or the position of the predetermined lens group including the lens having a certain curvature (refractive power) in the optical system, or by exchanging the lens group with another lens group.

However, when it is intended to correct the uneven illuminance by driving the lens having a certain curvature other than the flat plane, the uniformity of the coherence factor ($\sigma$ value) of the illumination light beam is occasionally deteriorated in the illumination area on the reticle as the mask, and in the exposure area on the wafer as the substrate to be exposed. When the uniformity of the $\sigma$ value is deteriorated in the exposure area as described above, an inconvenience arises such that the line width uniformity, which is the original object of the suppression of the uneven illuminance, is lowered. On the other hand, if the correction amount of the uneven illuminance is set so that the deterioration of the uniformity of the $\sigma$ value is suppressed, a limit appears in the line width control accuracy.

Especially, in recent years, the design rule (standard line width) of the semiconductor device becomes finer and finer year by year. In order to further improve the line width control accuracy, it is demanded to develop an exposure method which makes it possible to improve the uniformity of the exposure amount distribution without deteriorating the uniformity of the $\sigma$ value.

Taking the foregoing viewpoints into consideration, a first object of the present invention is to provide an exposure apparatus which makes it possible to correctly adjust an illumination optical system for a short period of time.

Further, a second object of the present invention is to provide an exposure apparatus which makes it possible to substantially automatically adjust an illumination optical system which is capable of making switch to a plurality of illumination conditions.

Further, a third object of the present invention is to provide a method for efficiently using such an exposure apparatus and a method for producing a highly accurate device based on the use of such an exposure apparatus.

A fourth object of the present invention is to provide an exposure method which makes it possible to improve the uniformity of the exposure amount distribution without substantially deteriorating the uniformity of the coherence factor of an exposure light beam.

A fifth object of the present invention is to provide an exposure apparatus which makes it possible to carry out the exposure method provided in accordance with the fourth object.

A sixth object of the present invention is to provide a method for producing a device, which makes it possible to produce the device with a high line width control accuracy by using the exposure method according to the present invention.

SUMMARY OF THE INVENTION

According to a first aspect of the present invention, there is provided an exposure apparatus for exposing a second object with an exposure light beam via a first object, the exposure apparatus comprising: an illumination system which is provided with an optical member and which illuminates the first object with the exposure light beam; an illumination condition-switching system which is arranged in the illumination system and which switches an illumination condition of the first object with the exposure light beam; and an adjusting system which adjusts a state of the optical member in the illumination system in order to control an illumination characteristic of the illumination system depending on the switched illumination condition.

According to the present invention as described above, when the illumination condition is switched with the illumination condition-switching system, the state of the optical member (for example, position in the optical axis direction, position in the direction perpendicular to the optical axis, and tilt angle) is adjusted by the aid of the adjusting system depending on the illumination condition after the switching operation. Accordingly, the predetermined illumination characteristic of the illumination system can be substantially automatically controlled to be in a desired state for a plurality of illumination conditions respectively. The adjusting system may include a driving system which moves the optical member, and a control system which controls the driving system depending on the switched illumination condition.

In this arrangement, an example of the predetermined illumination characteristic of the evaluation object is at least one of uneven illuminance of the exposure light beam and a collapse amount of a telecentric property (telecentricity) of the exposure light beam. Both of them are extremely important characteristics to obtain a high resolution on the second object. Further, it is desirable that the illumination characteristic of the evaluation objective includes an inclination component and a concave/convex component of the uneven illuminance of the exposure light beam, and inclination components (two-dimensional vector amounts) and a magnification component of the collapse amount of the telecentric property of the exposure light. The five components of the illumination characteristic can be easily controlled substantially singly by mutually independently driving a plurality of optical members in the illumination system.

Therefore, it is especially easy to effect the automatization.

It is desirable that the exposure apparatus further comprises a characteristic-measuring system which measures the illumination characteristic of the illumination system, wherein the control system determines and stores a relationship between a driving amount of the driving system and an amount of change of the illumination characteristic on the basis of a result of the measurement performed by the characteristic-measuring system. When the illumination characteristic is changed in a time-dependent manner, the illumination characteristic can be quickly restored to a desired state, for example, by periodically measuring the illumination characteristic with the characteristic-measuring system, by updating the previously stored relationship by means of calculation (simulation), or by simultaneously using both of the foregoing means (i.e., by updating the relationship by means of calculation during the periodic measurement of the illumination characteristic) so that the optical member is driven on the basis of the obtained result.

According to a second aspect of the present invention, there is provided an exposure apparatus for exposing a second object with an exposure light beam via a first object, the exposure apparatus comprising:

an illumination system which is provided with an optical member and which illuminates the first object with the exposure light beam;

a characteristic-measuring system which measures an illumination characteristic of the illumination system; and an adjusting system which adjusts a state of the optical member in accordance with a result of the measurement performed by the characteristic-measuring system.

According to the exposure apparatus as described above, the illumination system can be correctly adjusted for a short period of time by driving the adjusting system on the basis of the result of the measurement performed by the characteristic-measuring system provided with, for example, a spatial image-measuring system.

In the present invention as described above, when the illumination system includes an optical integrator (uniformizer or homogenizer) and a first optical system and a second optical system which introduce the exposure light beam passed through the optical integrator into an irradiation plane of the first object or a plane conjugate therewith, the following illumination characteristics can be controlled substantially mutually independently by performing the adjustment for the states of the foregoing optical members respectively as follows:

(a1) adjustment for the position of the optical integrator in the optical axis direction: magnification component of the collapse amount of the telecentric property of the exposure light beam;

(b1) adjustment for the position of the first optical system in the optical axis direction: concave/convex component of the uneven illuminance;

(c1) adjustment for the two-dimensional position of the second optical system in the direction perpendicular to the optical axis: inclination component of the collapse amount of the telecentric property (two-dimensional vector amount); and (d1) adjustment for the tilt angle of the second optical system: inclination component of the uneven illuminance in the tilting direction. It is desirable that the tilting angle corresponds to the non-scanning direction perpendicular to the scanning direction in the case of the exposure apparatus based on the scanning exposure system, because of the following reason. That is, the uneven illuminance is averaged owing to the integral effect in the scanning direction, while it is desirable to make the correction with the tilt, because no averaging effect is generated in the non-scanning direction.

In the present invention described above, it is desirable that the illumination system further includes an optical element which sets an illuminance distribution of the exposure light beam to a local area for modified illumination, a beam-shaping optical system which introduces the exposure light beam from an exposure light source into the optical element, a light-collecting optical system which introduces the exposure light beam from the optical element, and the optical integrator which uniformizes the illuminance distribution of the exposure light beam from the light-collecting optical system, wherein the adjusting system adjusts the state of the light-collecting optical system or the beam-shaping optical system.

In this arrangement, for example, the beam-shaping optical system is adjusted so that the magnitude of the illuminance of the exposure light beam and magnitude of the dispersion of the illuminance distribution of the exposure light beam are balanced. Thus, it is possible to decrease the uneven illuminance on condition that the loss of the exposure light beam is minimized.

According to a third aspect of the present invention, there is provided an exposure apparatus for exposing a second object with an exposure light beam via a first object, the exposure apparatus comprising:

an illumination system which illuminates the first object with the exposure light beam;

a characteristic-measuring system which measures an illumination characteristic of the illumination system; and a control system which independently determines a magnification component and an inclination component of a collapse amount of a telecentric property of the exposure light beam from the illumination characteristic measured by the characteristic-measuring system. It is easy to perform the adjustment substantially mutually independently by dividing the collapse amount of the telecentric property into the inclination component and the magnification component as described above. The control system may independently determine a concave/convex component and an inclination component of uneven illuminance of the exposure light beam afforded by the illumination system, from the illumination characteristic measured by the characteristic-measuring system.

According to a fourth aspect of the present invention, there is provided an exposure method for exposing a second object with an exposure light beam from an illumination, system via a first object, the exposure method comprising the steps of:

illuminating the first object with the exposure light beam;

measuring an illumination characteristic of the illumination system;

independently determining a magnification component and an inclination component of a collapse amount of a telecentric property of the exposure light beam from the measured illumination characteristic;

adjusting the illumination system on the basis of the determined magnification and the inclination components of the collapse amount of the telecentric property; and exposing the second object with the exposure light beam from the adjusted illumination system passing through the first object. According to this exposure method, the telecentric property of the illumination system can be adjusted easily for a short period of time. Thus, it is possible to improve the throughput. This method may further comprise the step of independently determining a concave/convex component and an inclination component of uneven illuminance of the exposure light beam afforded by the illumination system from the measured illumination characteristic.

According to a fifth aspect of the present invention, there is provided a method for adjusting an exposure apparatus provided with an illumination system for illuminating a first object with an exposure light beam, for exposing a second object with the exposure light beam via the first object, the method comprising the steps of:

setting a predetermined optical member in the illumination system in a plurality of states to measure an illumination characteristic of the illumination system in each state;

determining a relationship between an amount of change of the state of the optical member and an amount of change of the illumination characteristic on the basis of a result of the measurement of the illumination characteristic; and adjusting the state of the optical member in order to control the illumination characteristic on the basis of the determined relationship. According to this adjusting method, it is possible to efficiently adjust the illumination characteristic by previously determining the relationship between the driving amount of the optical member and the amount of change of the illumination characteristic. The method may further comprise the step of storing the determined relationship.

According to a sixth aspect of the present invention, there is provided an exposure method for exposing a second object with an exposure light beam via a first object, the exposure method comprising the steps of:

radiating the exposure light beam onto the first object; and controlling a transmittance distribution of the exposure light beam in a planer area traversing an optical axis of the exposure light beam in the vicinity of an exposure plane of the second object or in the vicinity of a plane conjugate with the exposure plane.

According to the exposure method as described above, the uneven illuminance is adjusted not by driving an optical element having a predetermined curvature other than the flat plane. The transmittance distribution of the planer area is controlled (especially controlled two-dimensionally) so that the uneven illuminance is corrected. Accordingly, the illuminance distribution can be controlled without substantially deteriorating the uniformity of the coherence factor of the exposure light beam in the exposure area of the second object. Therefore, the illuminance distribution is controlled so that the unevenness of the cumulative exposure amount on the second object is corrected, and thus it is possible to improve the uniformity of the exposure amount distribution so that the line width uniformity may be reliably improved. Further, the transmittance distribution is not fixed, it can be controlled variably two-dimensionally. Therefore, when any cloudiness or the like appears on the optical element such as those of the illumination system, and the illuminance distribution on the second object is changed in a time-dependent manner, then the transmittance distribution is controlled so that the change is offset. Thus, it is possible to always maintain high uniformity of the exposure amount distribution.

In this process, for example, the transmittance distribution for the exposure light beam is controlled to give a concentric distribution about the center of the optical axis so that the unevenness of the exposure amount distribution for the second object is corrected. When the concentric distribution is given as described above, it is possible to appropriately correct the uneven illuminance (centro-symmetrical unevenness) which is axially symmetrical with respect to the optical axis. Further, the centro-symmetrical unevenness can be corrected substantially continuously within a predetermined range by rotating the transmittance distribution.

In another example, the transmittance distribution for the exposure light beam is controlled to give a predetermined distribution in a first direction so that the unevenness of the exposure amount distribution for the second object is corrected. That is, the transmittance distribution is controlled to give a one-dimensional predetermined distribution. The direction of the one-dimensional distribution is variable. When the one-dimensional transmittance distribution is used as described above, it is possible to correct the unevenness of the cumulative exposure amount in the non-scanning direction (direction perpendicular to the scanning direction) when the scanning exposure is performed. That is, when the predetermined distribution is a distribution which changes one-dimensionally symmetrically about the center of the optical axis, the centro-symmetrical unevenness (quadratic function-like unevenness) can be corrected substantially continuously within a predetermined range after the scanning exposure. When the predetermined distribution is a distribution in which the transmittance is gradually increased or decreased as the position is separated farther from the optical axis, the inclination unevenness (linear function-like unevenness) can be corrected substantially continuously within a predetermined range after the scanning exposure.

The transmittance distribution for the exposure light beam may be further controlled in a direction intersecting the direction of the predetermined distribution with the same distribution as the predetermined distribution or with another distribution. When a plurality of one-dimensional transmittance distributions are combined, it is possible to correct the two-dimensional uneven illuminance such as the inclination unevenness and the centro-symmetrical unevenness in the stationary state. The present invention can be also applied to the exposure apparatus of the full filed exposure type such as the stepper. It is also possible to omit the mechanism for driving a large lens group to be used to correct the uneven illuminance.

In the scanning exposure system in which the first object and the second object are synchronously moved in a scanning direction when the second object is exposed, it is desirable that the transmittance distribution for the exposure light beam is controlled so that exposure amount distribution (exposure amount distribution in the non-scanning direction), which is obtained by adding up an exposure amount of the exposure light beam for the second object in the scanning direction, is uniformized. In this process, the uneven illuminance in the scanning direction is averaged by the scanning exposure. Therefore, the cumulative exposure amount distribution is uniformized on the entire surface of the second object by uniformizing the exposure amount distribution in the non-scanning direction perpendicular to the scanning direction. Thus, it is possible to obtain a high line width control accuracy.

According to a seventh aspect of the present invention, there is provided an exposure apparatus for exposing a second object with an exposure light beam via a first object, the exposure apparatus comprising:

an illumination system which illuminates the first object with the exposure light beam; and at least one filter which is arranged in the vicinity of an exposure plane of the second object or in the vicinity of a plane conjugate with the exposure plane on an optical path for the exposure light beam up to the second object and which has a predetermined transmittance distribution with respect to the exposure light beam.

According to the present invention as described above, the transmittance distribution can be controlled substantially continuously, for example, by mechanically rotating the filter, or by electrically rotating the transmittance distribution of the filter. Therefore, it is possible to carry out the exposure method according to the sixth aspect of the present invention. In this arrangement, the apparatus may further comprise a driving unit which controls an angle of rotation of the filter itself or which makes control to electrically rotate the transmittance distribution of the filter. Accordingly, it is possible to automatically correct the unevenness of the exposure amount.

In this arrangement, the illumination system may include one stage of optical integrator or a plurality of stages of optical integrators for uniformizing an illuminance distribution of the exposure light beam, and a field diaphragm for defining an illumination area on the first object of the exposure light beam from the optical integrator; wherein the filter may be arranged on a plane in the vicinity of the field diaphragm or on a plane in the vicinity of an irradiation plane of the first object. Accordingly, the filter can be easily arranged.

The filter may be composed of two sheets of a first filter and a second filter which have the same transmittance distribution in a one-dimensional direction symmetrically with respect to an optical axis respectively, and the two sheets of the filters may be rotated in mutually opposite phases. Accordingly, the centro-symmetrical unevenness can be corrected continuously by means of the simple control. When the present invention is applied to an exposure apparatus based on the scanning exposure system, it is desirable that the exposure apparatus further comprises a stage system which synchronously moves the first object and the second object in a scanning direction; an exposure amount distribution-measuring unit which measures a distribution of added-up value in the scanning direction of an exposure amount of the exposure light beam on the second object; and a control unit which controls an angle of rotation of the filter by the aid of the driving unit in accordance with the exposure amount distribution measured by the distribution-measuring unit. In this arrangement, the unevenness of the exposure amount can be corrected highly accurately by measuring the distribution of the added-up value in the non-scanning direction with the distribution-measuring unit, and rotating the filter so that the distribution is uniform.

According to an eighth aspect of the present invention, there is provided an exposure apparatus for illuminating a first object with an exposure light beam and exposing a second object with the exposure light beam via the first object, the exposure apparatus comprising:

an illumination optical system which is capable of illuminating the first object under a plurality of illumination conditions respectively and in which an illuminance distribution of the exposure light beam has an identical tendency for the plurality of illumination conditions respectively; and an optical member which is arranged on an optical path for the exposure light beam up to the second object and which adjusts the illuminance distribution.

According to the exposure apparatus of the present invention as described above, when the illumination condition is changed, for example, from the ordinary illumination to the modified illumination or the small a value illumination, the uniformity of the exposure amount distribution can be improved by offsetting the amount of change of the uneven illuminance by means of the optical member, for example, when the degree of the centro-symmetrical unevenness or the inclination unevenness is slightly changed.

In this arrangement, it is desirable that the illumination optical system is adjusted to have uneven illuminance in which the illuminance distribution is substantially symmetrical with respect to an optical axis of the illumination optical system. Accordingly, it is easy to correct the uneven illuminance. For example, the optical member includes at least one optical fiber which is arranged separately from an exposure plane of the second object or a conjugate plane thereof and which has a predetermined transmittance distribution with respect to the exposure light beam.

According to an ninth aspect of the invention, an exposure method for illuminating a first object with an exposure light beam and exposing a second object with the exposure light beam via the first object is provided. The exposure method comprises:

changing an illumination condition for the first object depending on a pattern to be transferred onto the second object;

adjusting an inclination component and a centro-symmetrical component of uneven illuminance or uneven exposure amount in an irradiation area of the exposure light beam, respectively; and adjusting the centro-symmetrical component without adjusting the inclination component during a predetermined period after the adjustment of the uneven illuminance or uneven exposure amount.

According to an tenth aspect of the invention, an exposure method for irradiating a first object with an exposure light beam via an illumination optical system and exposing a second object with the exposure light beam via the first object is provided. The exposure method comprises:

detecting the exposure light beam on a predetermined plane on which the second object is arranged to measure an illumination characteristic including at least one of a distribution of exposure amount or illuminance in an irradiation area of the exposure light beam and a telecentricity of the illumination optical system;

moving at least one optical element of the illumination optical system on the basis of the measured illumination characteristic;

updating the measured illumination characteristic by means of calculation until the illumination characteristic is measured next time; and moving the at least one optical element on the basis of the updated illumination characteristic.

A method for producing a device according to the present invention comprises the step of transferring a device pattern onto a substrate by using the exposure method according to any one of the aspects of the present invention. According to the present invention, it is possible to mass-produce a highly functional device with a high line width control accuracy.

BRIEF DESCRIPTION OF THE DRAWINGS

FIG. 6A shows, with partial cutout, main components to be used when the modified illumination is performed by an illumination optical system ILS shown in FIG. 1, and FIG. 6B shows a front view illustrating an aperture diaphragm plate 10 shown in FIG. 6A.

FIG. 7 shows an example of the relationship between the magnitude of illuminance and the uneven illuminance when the modified illumination is performed.

FIGS. 15A–15C show the concentration filter plate 51 and filter plates equivalent thereto.

FIG. 16 shows a perspective view illustrating the relationship concerning an illumination area 35 and an optical system ranging from a second fly's eye lens 9 to a fixed blind 14A of a projection exposure apparatus according to a fourth embodiment of the present invention.

DESCRIPTION OF THE PREFERRED EMBODIMENTS

An exemplary embodiment of the present invention will be explained below with reference to the drawings. In this embodiment, the present invention is applied to a scanning exposure type projection exposure apparatus based on the step-and-scan system or the step-and-stitch system.

First Embodiment

Figure 1:
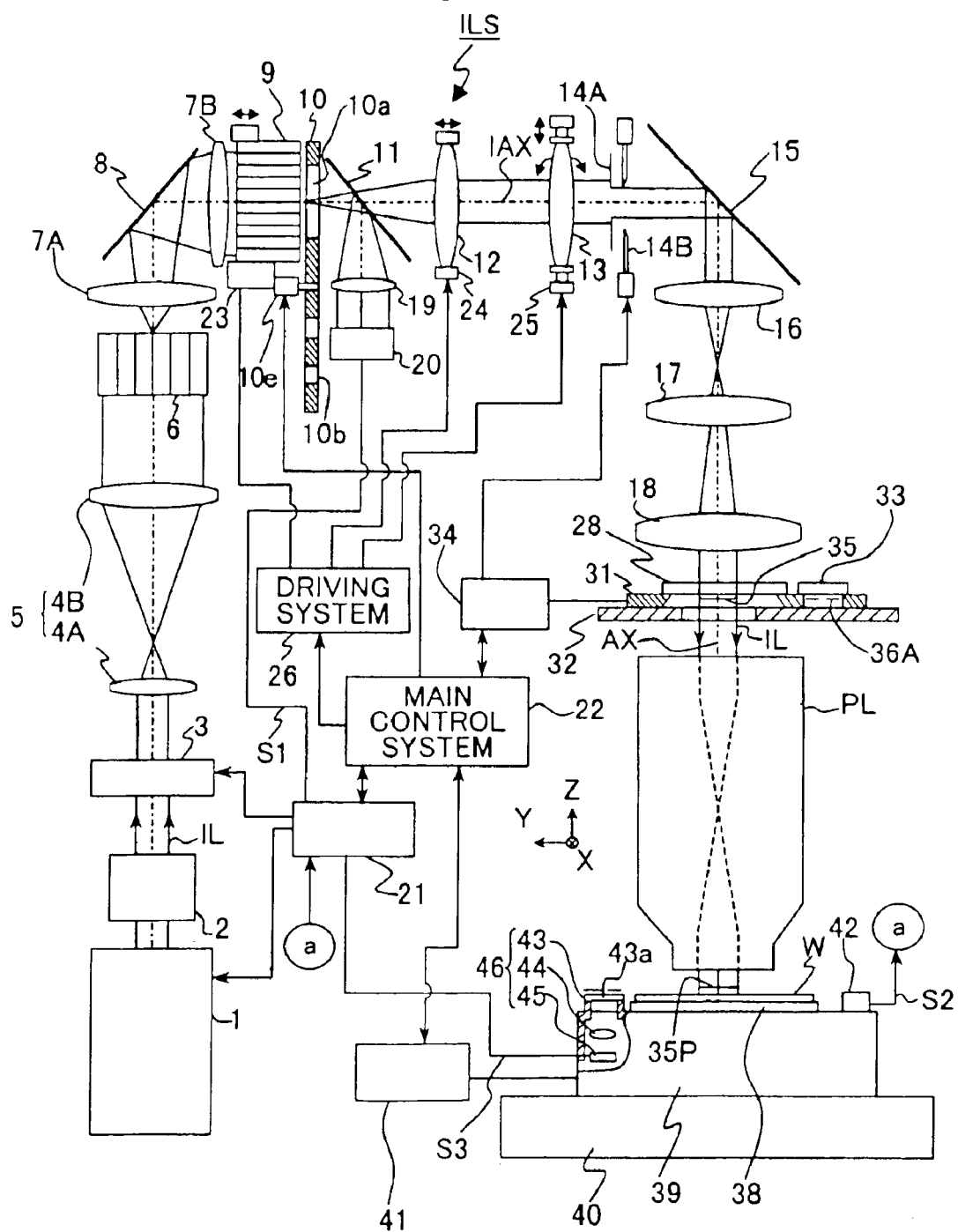
FIG. 1 shows, with partial cutout, a front view illustrating a projection exposure apparatus according to a first embodiment of the present invention.

FIG. 1 shows a schematic arrangement of a projection exposure apparatus of this embodiment. In FIG. 1, an ArF excimer laser light source (wavelength: 193 nm) is used as an exposure light source 1. However, those usable as the exposure light source 1 include, for example, a KrF excimer laser (wavelength: 248 nm), an $F_2$ laser (wavelength: 157 nm), a $Kr_2$ laser (wavelength: 146 nm), a high harmonic wave generator of YAG laser, a high harmonic wave generator of semiconductor laser, and a mercury lamp. An exposure light beam IL (exposure beam), which is composed of an ultraviolet pulse light beam having a wavelength of 193 nm radiated from the exposure light source 1, passes through a beam matching unit (BMU) 2 for positionally matching the optical path with respect to the main exposure apparatus body, and it comes into a variable light-reducing unit 3 to serve as a light attenuator. An exposure control unit 21, which is provided to control the exposure amount with respect to the photoresist on a wafer, controls the start and the stop of the light emission of the exposure light source 1 as well as the output (oscillation frequency and pulse energy). The dimming ratio for the variable light-reducing unit 3 is adjusted continuously or in a stepwise manner.

The exposure light beam IL, which has passed through the variable light-reducing unit 3, passes through a beam-shaping system 5 composed of a first lens system 4A and a second lens system 4B arranged along a predetermined optical axis, and it comes into a first fly's eye lens 6 to serve as a first stage optical integrator (uniformizer or homogenizer). The exposure light beam IL, which outgoes from the first fly's eye lens 6, comes into a second fly's eye lens 9 to serve as a second stage optical integrator via a first lens system 7A, an optical path-bending mirror 8, and a second lens system 7B. A relay optical system (or may be referred to as "beam-shaping system" as well), which serves as a light-collecting optical system, is constructed by the first lens system. 7A and the second lens system 7B.

An aperture diaphragm plate 10 is arranged rotatably by the aid of a driving motor 10e at a light-outgoing plane of the second fly's eye lens 9, i.e., an optical Fourier transformation plane (pupil plane of the illumination system) with respect to the pattern plane (reticle plane) of a reticle 28 as the exposure objective. As shown in a front view of FIG. 6B, the aperture diaphragm plate 10 is exchangeably arranged with a circular aperture diaphragm 10a for the ordinary illumination, an aperture diaphragm 10b for zonal illumination as an example of the modified illumination, an aperture diaphragm 10c composed of a plurality of (in this embodiment, four) eccentric small apertures for modified light source (or so-called oblique illumination) as another example of the modified illumination, and a small circular aperture diaphragm 10d for the small coherence factor (σ value). The aperture diaphragm 10c may be also referred to as the aperture diaphragm for the four-spot illumination. The "illumination condition-switching system" for switching the illumination condition into any one of the plurality of illumination conditions (ordinary illumination, modified illumination, and small σ value illumination) is constructed by the aperture diaphragm plate 10 and the driving motor 10e. The main control system 22, which collectively manages and controls the operation of the entire apparatus, sets the illumination condition by the aid of the driving motor 10e.

With reference to FIG. 1, the aperture diaphragm 10a for the ordinary illumination is installed at the light-outgoing plane of the second fly's eye lens 9. The exposure light beam IL, which outgoes from the second fly's eye lens 9 and which has passed through the aperture diaphragm 10a, comes into a beam splitter 11 having a high transmittance and having a low reflectance. The exposure light beam, which is reflected by the beam splitter 11, comes into an integrator sensor 20 composed of a photoelectric detector via a light-collecting lens 19. A detection signal S1 of the integrator sensor 20 is supplied to an exposure control unit 21. The relationship between the detection signal of the integrator sensor 20 and the illuminance of the exposure light beam IL on the wafer W as the substrate to be exposed is previously measured highly accurately, and it is stored in a memory in the exposure control unit 21. The exposure control unit 21 is constructed so that the illuminance (average value) of the exposure light beam IL with respect to the wafer W and the integral value thereof may be indirectly monitored in accordance with the detection signal of the integrator sensor 20.

The exposure light beam IL, which is transmitted through the beam splitter 11, passes along the optical axis IAX through a first lens system 12 (first optical system) and a second lens system 13 (second optical system), and it successively comes into a fixed blind (illumination field diaphragm which has an opening for defining the exposure area 35P on the wafer W (projection area which is conjugate with the illumination area 35 in relation to the projection optical system PL and onto which the image of the pattern in the illumination area 35 is formed) and the illumination area 35 on the reticle 28 irradiated with the exposure light beam IL and which has a width of the opening fixed in relation to at least the scanning direction of the scanning direction (Y direction) in which the reticle 28 and the wafer W are moved during the scanning exposure and the non-scanning direction (X direction) perpendicular to the scanning direction in this embodiment) 14A and a movable blind (movable illumination field diaphragm) 14B. The latter movable blind 14B is installed at the conjugate plane with respect to the reticle plane. The former fixed blind 14A is arranged at a plane which is defocused by a predetermined amount from the conjugate plane. For example, as disclosed in Japanese Laid-Open Patent Publication No. 4-196513, the fixed blind 14A has an opening which is arranged to extend in a linear slit configuration or in a rectangular configuration (hereinafter collectively referred to as "slit-shaped configuration") in the non-scanning direction substantially about the center of the optical axis AX in a circular field of the projection optical system PL. In order to avoid any unnecessary exposure upon the start and the end of the scanning exposure for the respective shot areas on the wafer W, the movable blind 14B is used to vary the width in the scanning direction of the exposure area 35P and the illumination area 35 defined by the fixed blind 14A. The movable blind 14B is also used to vary the width corresponding to the size of the pattern area of the reticle 28 concerning the direction (non-scanning direction) perpendicular to the scanning direction SD. The information on the opening ratio of the movable blind 14B is also supplied to the exposure control unit 21. The value, which is obtained by multiply the illuminance determined from the detection signal of the integrator sensor 20 by the opening ratio, is the actual illuminance on the wafer W. The arrangement of the fixed blind 14A and the movable blind 14B is not limited to the arrangement shown in FIG. 1. For example, the fixed blind 14A may be arranged closely to the reticle 28 between the reticle 28 and the illumination optical system.

The exposure light beam IL, which has passed through the fixed blind 14A during the exposure, radiates the illumination area (illumination field area) 35 on the pattern plane (lower surface) of the reticle 28 as the mask via an optical path-bending mirror 15, an image-forming lens system 16, a sub-condenser lens system 17, and a main condenser lens system 18. Under the illumination light beam IL, the image of the circuit pattern in the illumination area of the reticle 28 is transferred to the slit-shaped exposure area 35P of the photoresist layer on the wafer W as the substrate (substrate to be exposed) arranged at the image formation plane of the projection optical system PL at a predetermined projection magnification $\beta$ ($\beta$ is, for example ¼, ⅕) via the projection optical system PL which is telecentric on the both sides. The reticle 28 and the wafer W correspond to the first object and the second object of the present invention respectively. The wafer W is, for example, a disk-shaped substrate of semiconductor (silicon or the like), SOI (silicon on insulator) or the like. The projection optical system PL as the projection system of this embodiment is a dioptric system (refractive system). However, it is needless to say that the cata-dioptric system (reflecting refractive system) and the reflective system can be also used. The following description will be made assuming that the Z axis extends in parallel to the optical axis AX of the projection optical system PL, the Y axis extends in the scanning direction (direction parallel to the plane of paper of FIG. 1 in this embodiment) in the plane perpendicular to the Z axis, and the X axis extends in the non-scanning direction (direction perpendicular to the plane of paper of FIG. 1 in this embodiment) perpendicular to the scanning direction.

In FIG. 1, the illumination optical system ILS is constructed, for example, by the exposure light source 1, the beam matching unit 2, the variable light-reducing unit 3, the beam-shaping system 5, the first fly's eye lens 6, the first lens system 7A, the second lens system 7B, the second fly's eye lens 9, the first lens system 12, the second lens system 13, the fixed blind 14A, the movable blind 14B, the image-forming lens system 16, the sub-condenser lens system 17, and the main condenser lens system 18. The illumination optical system ILS or one obtained by adding the exposure light source thereto corresponds to the illumination system of the present invention. The optical axis IAX of the illumination optical system ILS is coincident with the optical axis AX of the projection optical system PL on the reticle 28. In this embodiment, a first driving unit 23, a second driving unit 24, a driving unit group 25 are installed to the second fly's eye lens 9, the first lens system 12, and the second lens system 13 respectively.

Figure 2:
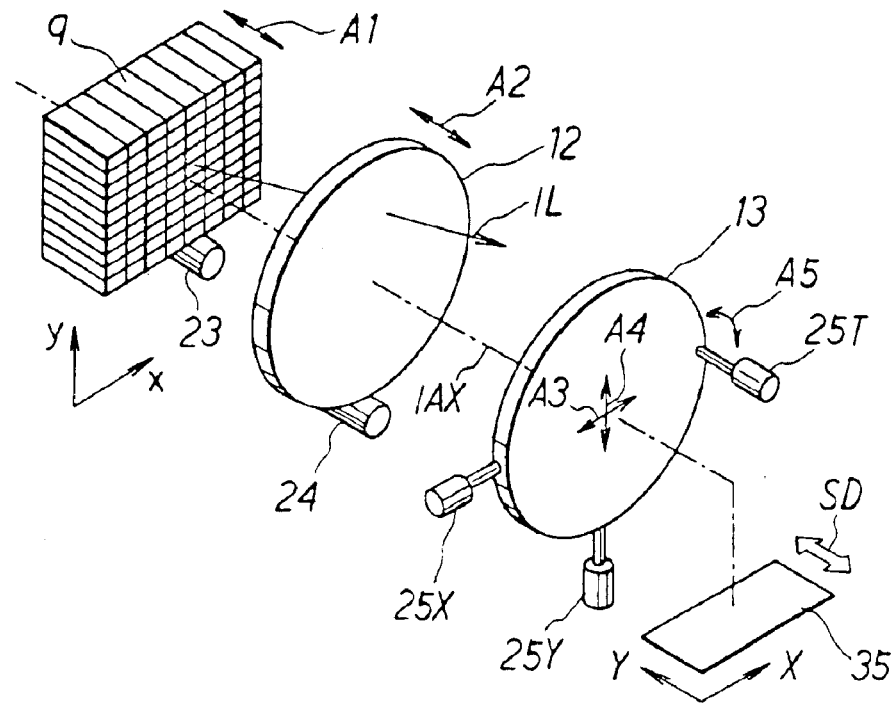
FIG. 2 shows a perspective view illustrating an illumination area 35 and an optical system ranging from a second fly's eye lens 9 to a second lens system 13 shown in FIG. 1.

FIG. 2 shows a perspective view illustrating the relationship between the illumination area 35 and the optical system ranging from the second fly's eye lens 9 to the second lens system 13 shown in FIG. 1. In FIG. 2, the scanning direction SD (Y direction) for the reticle with respect to the illumination area 35, and the direction on the second fly's eye lens 9 corresponding to the non-scanning direction (X direction) are the y direction and the x direction respectively. The first driving unit 23 adjusts the position of the second fly's eye lens 9 in the direction of the optical axis IAX (direction of the arrow A1). The second driving unit 24 adjusts the position of the first lens system 12 in the direction of the optical axis IAX (direction of the arrow A2). The driving unit group 25 shown in FIG. 1 is constructed by a third driving unit 25X, a fourth driving unit 25Y, and a fifth driving unit 25T shown in FIG. 2. The driving units 25X, 25Y adjust positions of the second lens system 13 in the y direction (direction of the arrow A4) and the x direction (direction of the arrow A3) perpendicular to the optical axis IAX of the second lens system 13 respectively. The driving unit 25T adjusts the tilt angle of the second lens system 13 about the axis passing through the optical axis IAX and parallel to the y axis (direction of the arrow A5). In other words, the driving unit 25T adjusts the tilt angle (angle of inclination) of the lens system 13 in the direction corresponding to the non-scanning direction of the illumination area 35.

Those usable as the driving units 23 to 25T include, for example, a micrometer based on the electric system, and a driving unit for displacing a flange section of an optical member as a driving objective with a driving element such as a piezoelectric element. In this case, each of the driving units 23 to 25T is incorporated with an encoder (for example, a rotary encoder) (not shown) to indicate the displacement amount of the optical member within a range capable of driving (driving stroke). Detection signals from the encoders are supplied to the driving system 26 shown in FIG. 1. The driving system 26 controls the states of the second fly's eye lens 9, the first lens system 12, and the second lens system 13 by the aid of the driving units 23 to 25T on the basis of the driving information from the main control system 22 and the detection signals. Alternatively, for example, an electrostatic capacity sensor may be used for the encoder for the driving unit 23 to 25T.

In this embodiment, as shown in FIG. 6A, the arrangement is made such that when the modified illumination is performed, the first fly's eye lens 6 can be exchanged with an light amount distribution-converting element 55 composed of a diffractive optical element (DOE) by using a switching unit 56. The light amount distribution-converting element 55 corresponds to the optical element for setting the exposure light beam to a local area.

In FIG. 6A, when the modified illumination is performed, for example, the aperture diaphragm 10b having the zonal configuration (or the aperture diaphragm 10c for the four-spot illumination) is installed at the light-outgoing plane of the second fly's eye lens 9. The light amount distribution-converting element 55 collects the exposure light beam IL to the area having a substantially zonal configuration of the light-incoming plane of the second fly's eye lens 9 by means of the diffracting effect. The light amount distribution-converting element 55 is also included in the illumination optical system ILS. Accordingly, the efficiency of use of the exposure light beam IL is enhanced. A high illuminance is obtained on the wafer even when the modified illumination is performed. In this process, a driving unit 58 for adjusting the position of the second lens system 7B in the direction of the optical axis IAX, a driving unit 62 for adjusting the position of the first lens system 7A in the two-dimensional direction perpendicular to the optical axis, and a driving unit 57 for adjusting the position u of the second lens system 4B of the beam-shaping system 5 in the direction of the optical axis IAX are used. An encoder is also provided for each of the driving units 57, 58, 62 composed of, for example, a micrometer based on the electric system. The arrangement is made such that the driving system 26 is capable of controlling the states of the second lens system 57, the second lens system 7B, and the first lens system 7A by the aid of the driving units 57, 58, 62 on the basis of the driving information of the main control system 22 shown in FIG. 1 and the detection signals obtained by the encoders. The switching unit 56 may be provided with a plurality of light amount distribution-converting elements for generating exposure light beams IL having different illumination areas (intensity distributions) on the light-incoming plane of the second fly's eye lens 9. The light amount distribution-converting element, with which the efficiency of use of the exposure light beam IL is the highest, is selected to be arranged in the illumination optical path depending on the illumination condition (i.e., the intensity distribution of the exposure light beam IL on the pupil plane of the illumination optical system, or one of the plurality of aperture diaphragms 10a to 10d arranged in the illumination optical path in this embodiment). In this arrangement, it is not necessarily indispensable to provide the first fly's eye lens 6 for the switching unit 56.

With reference to FIG. 1 again, the reticle 28 is attracted and held on a reticle stage 31. The reticle stage 31 is placed so that it is movable at a constant velocity in the Y direction on a reticle base 32, and it is finely movable in the X direction, the Y direction, and the direction of rotation. The two-dimensional position and the angle of rotation of the reticle stage 31 (reticle 28) are measured in real time by the aid of laser interferometers in a driving control unit 34. Based on the result of the measurement and the control information from the main control system 22, a driving motor (for example, a linear motor or a voice coil motor) in the driving control unit 34 controls the scanning velocity and the position of the reticle stage 31. An evaluation mark plate 33 composed of a glass plate is fixed in the vicinity of the reticle 28 on the reticle stage 31.

Figure 3A:
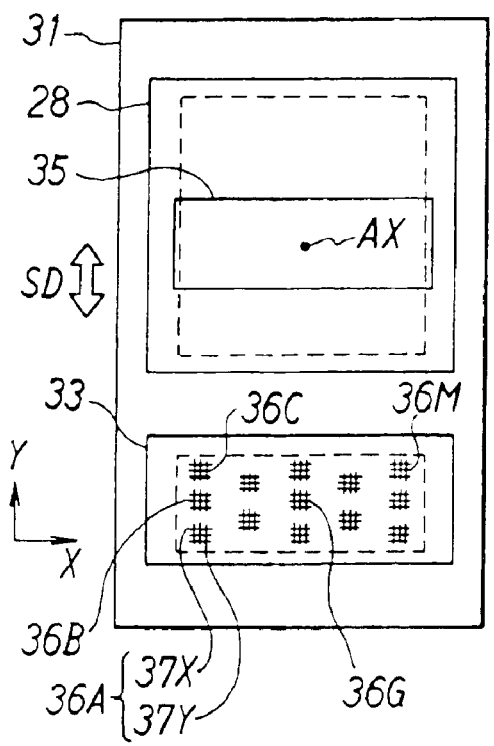
FIG. 3A shows a plan view illustrating a reticle stage 31 and an evaluation mark plate 33.

FIG. 3A shows a plan view illustrating the reticle stage 31 shown in FIG. 1. In FIG. 3A, the evaluation mark plate 33 is fixed on an opening of an area adjacent to the reticle 28 on the reticle stage 31 in the scanning direction SD (Y direction). For example, thirteen two-dimensional identical evaluation marks 36A, 36B, . . . 36M are formed in a substantially uniform distribution in an area having approximately the same size as that of the illumination area 35 of the evaluation mark plate 33. The evaluation mark 36A is a two-dimensional mark obtained by combining an X axis mark 37×composed of a line-and-space pattern arranged at a predetermined pitch in the X direction, and a Y axis mark 37Y composed of a line-and-space pattern arranged at a predetermined pitch in the Y direction. Alternatively, it is possible to use, for example, a box-in-box mark. In this embodiment, as described later on, when the collapse amount of the telecentric property of the illumination optical system is measured, then the reticle stage 31 is driven in the Y direction to allow the center of the evaluation mark plate 33 (center of the evaluation mark 36G) to coincide with the center of the illumination area 35 (optical axis AX), and the images of the evaluation marks 36A, 36B, . . . 36M are projected onto the wafer via the projection optical system PL. The image 36AP of the evaluation mark 36A is shown in a magnified view in FIG. 3B.

With reference to FIG. 1 again, the wafer W is attracted and held on a wafer stage 39 by the aid of a wafer holder 38. The wafer stage 39 is movable two-dimensionally along the XY plane which is parallel to the image plane of the projection optical system PL on a wafer base 40. That is, the wafer stage 39 is movable at a constant velocity in the Y direction on the wafer base 40, and it is movable in a stepping manner in the X direction and in the Y direction. Further, a Z leveling mechanism for controlling the position of the wafer W in the Z direction (focus position) and the angle of rotation about the X axis and the Y axis is also incorporated into the wafer stage 39. A multiple-point autofocus sensor (not shown) for measuring the focus position at a plurality of measuring points on the surface of the wafer W is also provided. During the exposure, the Z leveling mechanism is driven in accordance with the autofocus system on the basis of the measured value of the autofocus sensor.

Accordingly, the surface of the wafer W is focused on the image plane of the projection optical system PL. When the illumination characteristic is measured, for example, the Z leveling mechanism in the wafer stage 39 is driven on the basis of the measured value of the autofocus sensor. Accordingly, the focus position on the upper surface of the wafer stage 39 can be controlled by an arbitrary amount.

The positions of the wafer stage 39 in the X direction and the Y direction and the angles of rotation about the X axis, the Y axis, and the Z axis are measured in real time by laser interferometers in the driving control unit 41. Based on the result of the measurement and the control information from the main control system 22, a driving motor (for example, a linear motor) in the driving control unit 41 controls the position and the scanning velocity of the wafer stage 39.

The main control system 22 sends, to the driving control units 34, 41, various pieces of information concerning, for example, the movement position, the movement velocity, the rate of acceleration of the movement, and the position offset of each of the reticle stage 31 and the wafer stage 39. During the scanning exposure, the wafer W is scanned at a velocity of $\beta \cdot Vr$ ($\beta$ is the projection magnification from the reticle 28 to the wafer W) in the −Y direction (or in the +Y direction) with respect to the exposure area 35P of the pattern image of the reticle 28 by the aid of the wafer stage 39 in synchronization with the scanning of the reticle 28 at a velocity Vr in the +Y direction (or in the −Y direction) with respect to the illumination area 35 of the exposure light beam IL by the aid of the reticle stage 31. During this process, in order to avoid any exposure for unnecessary portions upon the start and the end of the scanning exposure, the opening/closing operation of the movable blind 14B is controlled by the driving control unit 34.

Further, the main control system 22 reads, from the exposure data file, various exposure conditions to perform the scanning exposure in a proper exposure amount for the photoresist in the respective shot areas on the wafer W to execute an optimum exposure sequence in combination with the exposure control unit 21 as well. That is, when the command to start the scanning exposure for one shot area on the wafer W is given from the main control system 22 to the exposure control unit 21, then the exposure control unit 21 starts the light emission of the exposure light source 1, and it calculates an integral value of the illuminance of the exposure light beam IL with respect to the wafer W (sum of the pulse energy per unit time) by the aid of the integrator sensor 20. The integral value is reset to zero upon the start of the scanning exposure. The exposure control unit 21 successively calculates the integral value of the illuminance. Based on the obtained result, the exposure control unit 21 controls the output of the exposure light source 1 (oscillation frequency and pulse energy) and the dimming ratio of the variable light-reducing unit 3 so that the proper exposure amount is obtained at the respective points of the photoresist on the wafer W after the scanning exposure. When the scanning exposure for the concerning shot area is completed, the light emission of the exposure light source 1 is stopped.

An uneven illuminance sensor 42, which is composed of a photoelectric detector and which has a pin hole-shaped light-receiving section 42a (see FIG. 4A), is installed in the vicinity of the wafer holder 38 on the wafer stage 39 of this embodiment. A detection signal S2 of the uneven illuminance sensor 42 (exposure amount distribution-measuring unit) is also supplied to the exposure control unit 21. The uneven illuminance sensor 42 may be used, for example, with a light-receiving section (corresponding to the light-receiving section 42b shown in FIG. 13A) composed of, for example, a line sensor or a CCD extending in the scanning direction (Y direction) in which the wafer W is relatively moved with respect to the exposure area 35P during the scanning exposure, in place of or in combination of the pin hole-shaped light-receiving section 42a. In this case, illuminances, which are detected at a plurality of points in the scanning direction in the exposure area 35P respectively, may be added up at respective positions concerning the non-scanning direction (X direction) perpendicular to the scanning direction, and the illuminance distribution concerning the non-scanning direction may be determined on the basis of the added-up value. It is possible to obtain the illuminance distribution (uneven illuminance) in the non-scanning direction in consideration of the averaging effect of the uneven illuminance in the scanning direction by the scanning exposure, i.e., the exposure amount distribution (exposure amount unevenness) concerning the non-scanning direction on the wafer after the scanning exposure. Therefore, the optimization of the illumination characteristic (correction of the uneven illuminance) described later on may be performed by using the result of the measurement. The same or equivalent illuminance distribution can be also determined by using the pin hole-shaped light-receiving section 42a by two-dimensionally moving the wafer stage 39 during the measurement of the illuminance. Although not shown, a radiation amount monitor, which has a light-receiving section to cover the entire exposure area 35P, is also installed. A coefficient, which is used to indirectly determine the illuminance on the wafer W from the detection signal of the integrator sensor 20, is calculated on the basis of the detection signal of the radiation amount monitor and the detection signal of the integrator sensor 20. Further, a scanning plate 43, which is composed of a glass substrate, is installed in the vicinity of the wafer holder 38 on the wafer stage 39. A substantially square opening pattern 43a is formed in a light-shielding film on the scanning plate 43. A light-collecting lens 44 and a photoelectric detector 45 are arranged on the bottom surface side of the scanning plate 43 in the wafer stage 39. A spatial image-measuring system 46 is constructed by the scanning plate 43, the light-collecting lens 44, and the photoelectric detector 45. A detection signal S3 of the photoelectric detector 45 is supplied to a calculating section in the exposure control unit 21. Only a part of the spatial image-measuring system 46 (including, for example, the scanning plate 43 and at least a part of the light-feeding system including, for example, the light-collecting lens 44 in this embodiment) may be provided on the wafer stage 39. The remaining constitutive components (for example, the photoelectric detector 45) may be arranged at the outside of the wafer stage 39. As for the spatial image-measuring system 46, only one opening pattern 43a is formed for the scanning plate 43. When the illumination characteristic is measured as described later on, then the wafer stage 39 is subjected to two-dimensional stepping, and the opening pattern 43a is relatively moved in the scanning direction and the non-scanning direction (X direction and Y direction) respectively with respect to the respective images of the plurality of (thirteen, in this embodiment) evaluation marks arranged in the illumination area 35. For example, the opening patterns 43a of the same number as that of the plurality of evaluation marks may be formed on the scanning plate 43. The respective images of the plurality of evaluation marks may be collectively detected respectively during the relative movement of the image of the evaluation mark and the opening pattern concerning the scanning direction and during the relative movement of the image of the evaluation mark and the opening pattern concerning the non-scanning direction. Further, for example, the opening patterns 43a of the same number as that of the plurality of (five, in this embodiment) evaluation marks separated in the non-scanning direction may be formed on the scanning plate 43 in the non-scanning direction. The wafer stage 39 may be moved in the scanning direction to continuously detect the images of the respective evaluation marks arranged in the scanning direction for each of the opening patterns. Oppositely to the above, the opening patterns 43a of the same number as that of the evaluation marks may be formed on the scanning plate 43 concerning the scanning direction. The wafer stage 39 may be moved in the non-scanning direction to continuously detect the images of the evaluation marks for each of the opening patterns. In this procedure, it is preferable that the movable blind 14B is driven in accordance with the movement of the wafer stage 39 so that only a part of the illumination area 35 is irradiated with the exposure light beam IL during the detection of the plurality of evaluation marks. In the former, it is necessary that the wafer stage 39 is subjected to the stepping in the scanning direction when the image of the evaluation mark and the opening pattern are relatively moved concerning the non-scanning direction. In the latter, it is necessary that the wafer stage 39 is subjected to the stepping in the non-scanning direction when the image of the evaluation mark and the opening pattern are relatively moved concerning the scanning direction. Therefore, the wafer stage 39 may be merely moved once in each of the scanning direction and the non-scanning direction by combining the both.

Figure 3B:
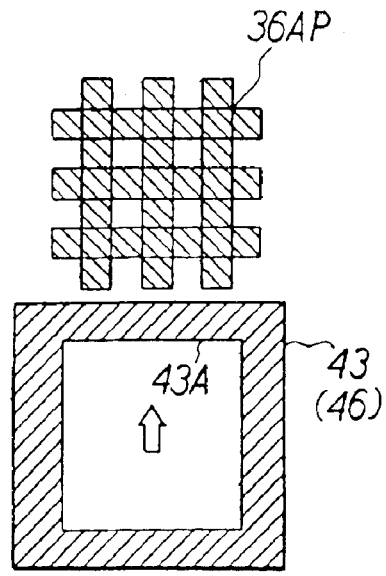
FIG. 3B shows a magnified plan view to illustrate a method for detecting an image 36AP of an evaluating mark.

For example, as shown in FIGS. 3A and 3B, when the position of the image 36AP of the evaluation mark 36A in the Y direction is measured, then the opening pattern 43a of the scanning plate 43 is moved to a position in front of the image 36AP, and then the wafer stage 39 is driven to scan the image 36AP with the opening pattern 43a. During this process, the position information on the wafer stage 39 is also supplied to the exposure control unit 21 by the aid of the main control system 22. The calculating section in the exposure control unit 21 calculates the position of the image 36AP in the Y direction from the signal which is obtained by differentiating the detection signal of the photoelectric detector 45 concerning the position of the wafer stage 39 in the X direction. Similarly, the position of the image 36AP in the X direction is also calculated by scanning the image 36AP in the X direction with the opening pattern 43a. The position information on the image 36AP in the X direction and the Y direction is supplied to the main control system 22.

With reference to FIG. 1 again, the evaluation mark plate 33 on the reticle stage 31, the uneven illuminance sensor 42 on the side of the wafer stage 39, and the spatial image-measuring system 46 correspond to the characteristic-measuring system for measuring the predetermined illumination characteristic (optical characteristic) of the present invention.

Next, an example of the adjusting operation for optimizing the predetermined illumination characteristic of the illumination optical system of this embodiment will be explained. This embodiment selects, as the first set of the predetermined illumination characteristic, the dispersion of the illuminance distribution of the exposure light beam IL in the illumination area 35 and consequently in the exposure area 35P (hereinafter referred to as "uneven illuminance"), and the collapse amount of the telecentric property of the exposure light beam IL with respect to the reticle 28 (hereinafter referred to as "illumination telecentricity"), because of the following reason. That is, the two illumination characteristics most greatly affects the projected image formed by the projection optical system PL and the photoresist on the wafer W.

The uneven illuminance is divided into the primary component (referred to as "inclination component") concerning the position of the exposure area 35P in the non-scanning direction (X direction) and the secondary component (referred to as "concave/convex component") concerning the position. That is, assuming that the illuminance is represented by a function PF(X) of the position X, the illuminance PF(X) can be approximated as follows. The coefficient a represents the inclination component, and the coefficient b represents the concave/convex component. In this case, the uneven illuminance component in the scanning direction (Y direction) is averaged by the scanning exposure. Therefore, the uneven illuminance component in the scanning direction is not especially an evaluation object in this embodiment. The concave/convex component is also a component which is symmetrical with respect to the optical axis (axially symmetrical component).

$$PF(X) = a \cdot X + b \cdot X^2 + \text{offset} \tag{1A}$$

The illumination telecentricity is divided into the inclination components (shift components) c, d corresponding to the average angles of inclination in the X direction and the Y direction of the exposure light beam in the illumination area 35 (exposure area 35P), and the magnification component e corresponding to the average angle of inclination in the radial direction with respect to the optical axis of the exposure light beam. In this case, the focus position of the wafer stage 39 is set to the position defocused by ±δ with respect to the focusing position of the wafer stage 39 in this embodiment. The positions (distortion amounts) of images of a large number of evaluation marks are measured at the respective focus positions by using the spatial image-measuring system 46. The inclination components c, d can be determined from the average shift amount of the image of the evaluation mark with respect to the amount of change of the focus position. The magnification component e can be determined by the average shift amount of the image of the evaluation mark in the radial direction.

In this embodiment, as having been explained with reference to FIG. 2, the states of the second fly's eye lens 9, the first lens system 12, and the second lens system 13 can be controlled by the aid of the five driving units 23, 24, 25X, 25Y, 25T respectively. The control as described above makes it possible to control the respective illumination characteristics described above substantially independently as follows.

(a2) positional adjustment for the second fly's eye lens 9 in the optical axis direction by the aid of the first driving unit 23: magnification component e [mrad] of the illumination telecentricity;

(b2) positional adjustment for the first lens system 12 in the optical axis direction by the aid of the second driving unit 24: concave/convex component b [%] of the uneven illuminance;

(c2) positional adjustment for the second lens system 13 in the x direction by the aid of the third driving unit 25X :

inclination component c [mrad] in the X direction of the illumination telecentricity;

(c3) positional adjustment for the second lens system 13 in the y direction by the aid of the fourth driving unit 25Y: inclination component d [mrad] in the Y direction of the illumination telecentricity;

(d2) tilt angle adjustment for the second lens system 13 by the aid of the fifth driving unit 25T: inclination component a [%] in the non-scanning direction of the uneven illuminance.

As described above, in this embodiment, the combination of the optical members for which the state can be controlled is optimized so that only one type of the illumination characteristic (optical characteristic) is substantially changed, and the other illumination characteristics are not changed, when the state of the corresponding optical member is controlled by using arbitrary one driving unit of the plurality of driving units 23 to 25T. Accordingly, the automatic adjustment for the illumination characteristic can be executed highly accurately by means of the simple control. All of the basic illumination characteristics can be automatically controlled by allowing the number of individuals of the driving units to be five. However, for example, when the illumination characteristic as the control objective is only the illumination telecentricity, the number of individuals and the arrangement of the driving units are changed depending on the illumination characteristic of the control objective, for example, such that the number of individuals of the driving units is three.

Actually, it is also feared that other illumination characteristics are slightly affected concerning the five driving units. Therefore, it is desirable to also consider the influence on other illumination characteristics.

Figure 8:
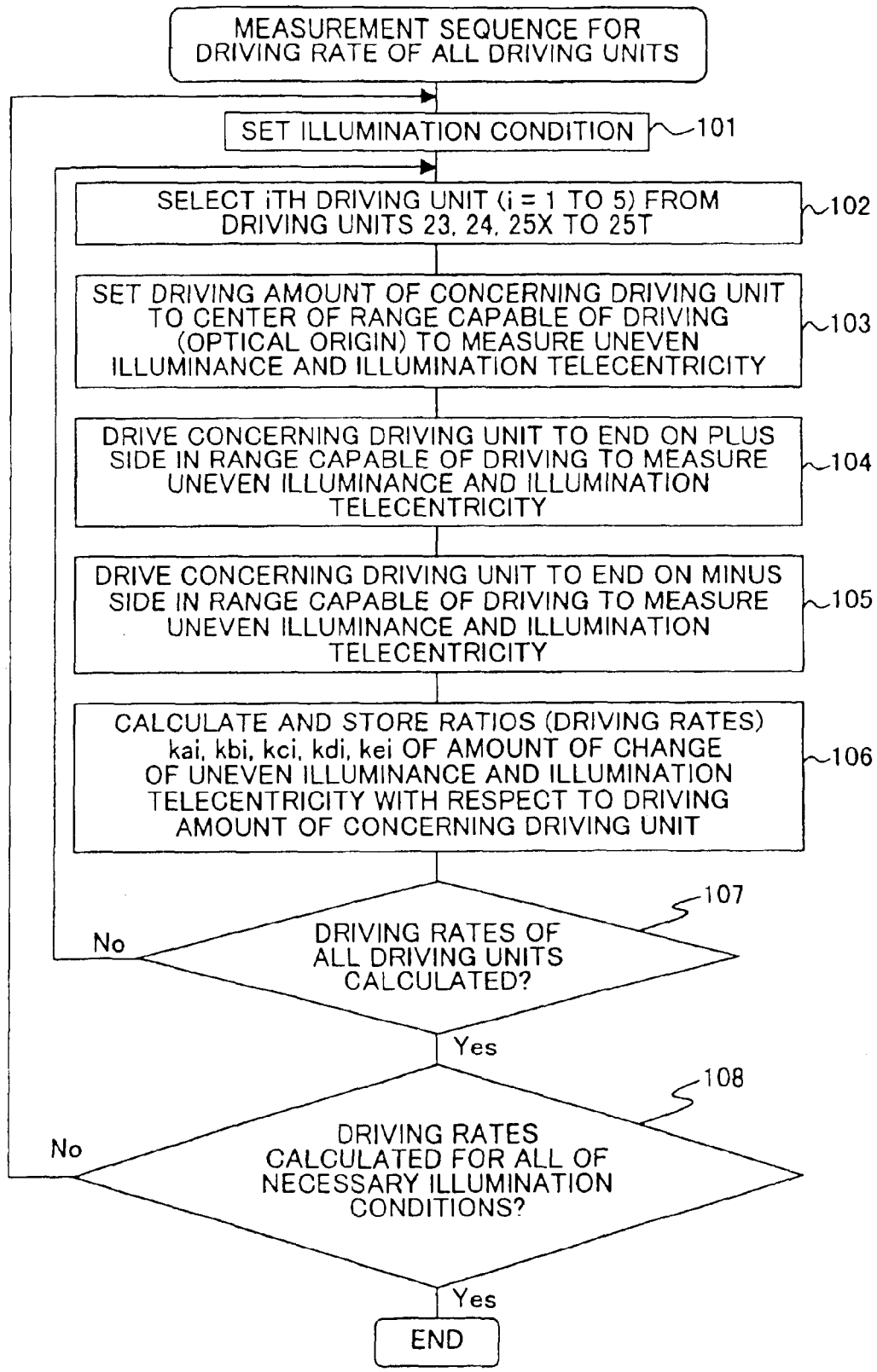
FIG. 8 shows a flow chart illustrating an example of a measurement sequence for the driving rate of the entire driving unit in the illumination optical system.

Accordingly, at first, as shown in a flow chart in FIG. 8, the driving rate is determined, which indicates how much the corresponding illumination characteristic is successfully changed when the five driving units 23, 24, 25X, 25Y, 25T are driven in unit amount.

That is, in the step 101 shown in FIG. 8, the aperture diaphragm plate 10 shown in FIG. 1 is controlled to set the illumination condition to any one of those for the ordinary illumination, the modified illumination (zonal illumination or four-spot illumination), and the small σ value illumination. In the next step 102, the ith driving unit (i=1 to 5) of the five driving units 23 to 25T is selected. In this case, it is assumed that the second driving unit 24 corresponding to the first lens system 12 is selected. In the next step 103, the driving amount d2 of the driving unit 24 is set to the center (d2=0) of the range capable of driving, and the first lens system 12 is set at the optical origin which is the designed position. In this state, the uneven illuminance and the illumination telecentricity are measured.

In order to measure the uneven illuminance, a glass substrate, on which no pattern is formed, is installed in place of the reticle 28 on the reticle stage 31 shown in FIG. 1. The illumination area 35 is irradiated with the exposure light beam IL. The exposure area 35P is scanned in the non-scanning direction (X direction) with the light-receiving section of the uneven illuminance sensor 42 to incorporate the detection signal S2 of the uneven illuminance sensor 42 into the exposure control unit 21. In place of the glass substrate, an area in which no pattern is formed in the reticle 28, or an area in which no evaluation mark is formed in the evaluation mark plate 33 may be used.

Figure 4A:
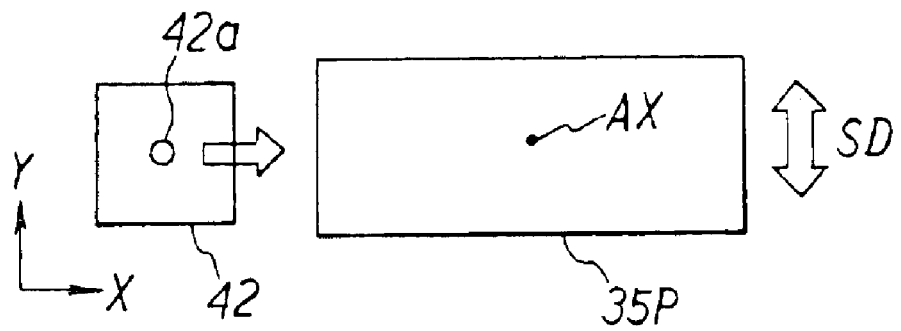
FIGS. 4A–4C illustrate a method for measuring an inclination component and a concave/convex component of uneven illuminance.
Figure 4B:
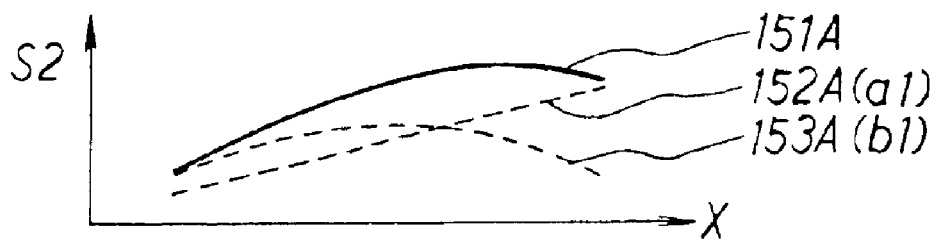

FIG. 4A shows a state in which the exposure area 35P is scanned in the X direction with the light-receiving section 42a of the uneven illuminance sensor 42. A curve 151A shown in FIG. 4B depicts the detection signal S2 plotted in this state corresponding to the position of the uneven illuminance sensor 42 (wafer stage 39) in the X direction. The calculating section in the exposure control unit 21 of this embodiment calculates the value a1 of the inclination component a of the uneven illuminance and the value b1 of the concave/convex component b by approximating the curve 151A in accordance with the least square method with respect to the right side of the expression (1A). The origin in the X direction in this process is the optical axis AX of the projection optical system PL. As depicted by broken lines, when the curve 151A is divided into a linear straight line 152A and a quadric curve 153A, then the slope of the straight line 152A is a1, and the coefficient of $X^2$ of the quadric curve 153A is b1.

Figures 5B, 5C:
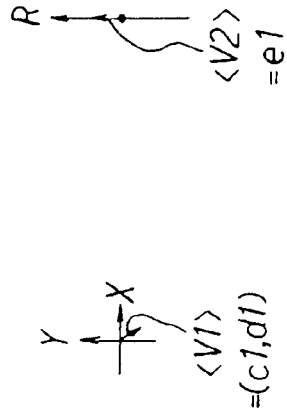
FIGS. 5A–5F illustrates a method for measuring an inclination component and a magnification component of illumination telecentricity.
Figure 5A:
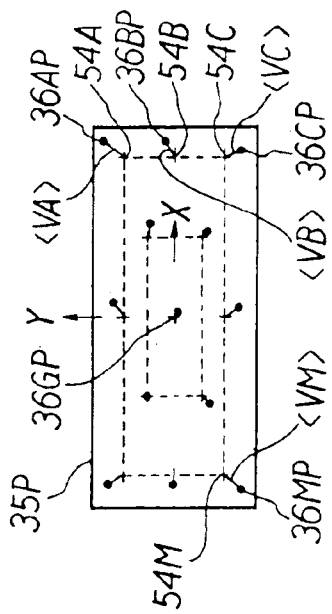

Subsequently, with reference to FIG. 1, in order to measure the illumination telecentricity, the reticle stage 31 is driven to move the center of the evaluation mark plate 33 to the center of the illumination area 35. The wafer stage 39 is driven to move the scanning plate 43 of the spatial image-measuring system 46 to a position in the vicinity of the exposure area 35P. The Z leveling mechanism in the wafer stage 39 is driven so that the focus position of the scanning plate 43 is set to be higher than the image plane (best focus position) with respect to the projection optical system PL by +δ (δ is previously set within a range in which a predetermined resolution is obtained). The radiation of the exposure light beam IL is started. As shown in FIG. 5A, the images 36AP to 36MP of the evaluation marks 36A to 36M of the evaluation mark plate 33 are projected onto the wafer stage 39. In this state, as having been explained with reference to FIG. 3B, the images 36AP to 36MP are scanned in the X direction and the Y direction with the opening pattern 43a of the scanning plate 43. The obtained detection signal S3 is processed by the calculating section in the exposure control unit 21. Accordingly, the positions of the images 36AP to 36MP in the X direction and the Y direction are calculated. The results of the calculation are supplied to the main control system 22. The origin in this case is, for example, the center of the image 36GP of the central evaluation mark 36G. It is desirable that the movable blind 14B is driven in accordance with the movement of the wafer stage 39 to radiate the exposure light beam IL onto only a part of the illumination area 35, for example, only the evaluation mark for which the image is to be detected by using the spatial image-measuring system 46 during the operation of the detection described above.

The images of the evaluation marks 36A to 36M, which are measured by defocusing the scanning plate 43 by +δ, are designated as images 54A to 54M on the lattice depicted by broken lines in FIG. 5A. For convenience of explanation, the lattice of broken lines is depicted in a rectangular configuration, however, it is actually distorted to some extent due to any distortion in some cases.

Subsequently, the focus position of the scanning plate 43 is set to be lower than the best focus position by −δ. Similarly, the positions in the X direction and the Y direction of the images 36AP to 36MP of the evaluation marks 36A, 36B, . . . 36M are determined by using the spatial image-measuring system 46. The obtained results are supplied to the main control system 22. FIG. 5A shows the images 36AP to 36MP in this case and the images 54A to 54M previously measured. As shown in FIG. 5A, the main control system 22 determines, as vectors <VA> to <VM>, the two-dimensional positional discrepancy amounts in the X direction and the Y direction of the images 36AP to 36MP as obtained when the focus position is defocused by −δ, with respect to the images 54A to 54M as obtained when the focus position is defocused by +δ. The simple average value $<V1>$ $(=(c1, d1))$ of the vectors, and the average value $<V2>(=e1)$ of the component in the radial direction (R direction) with respect to the origin are calculated as shown in FIGS. 5B and 5C. The average value (c1, d1) is the inclination component of the illumination telecentricity, and the average value e1 is the magnification component of the illumination telecentricity.

Figure 4C:
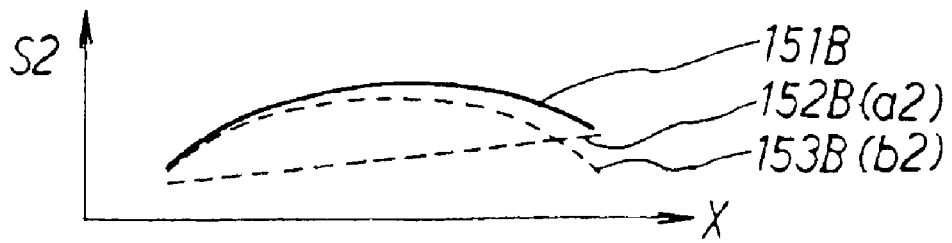
Figures 5D, 5E, 5F:
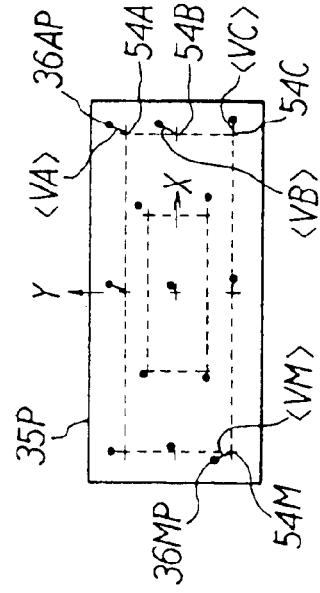

Subsequently, in the step 104, the uneven illuminance and the illumination telecentricity are measured in a state in which the driving amount d2 of the driving unit 24 is set to the end (d2=d2max) on the plus side in the range capable of driving. Accordingly, as shown in FIG. 4C, a curve 151B of the detection signal S2 of the uneven illuminance sensor 42 is obtained. The curve 151B is divided into a linear straight line 152B and a quadric curve 153B. Thus, the inclination component a2 and the concave/convex component b2 of the uneven illuminance are obtained. As shown in FIGS. 5E and 5F, the inclination component (c2, d2) of the illumination telecentricity and the magnification component e2 of the illumination telecentricity are obtained from the vectors $<VA>$ to $<VM>$ of the positional discrepancy of the images 36AP to 36MP of the evaluation marks 36A to 36M shown in FIG. 5D.

Subsequently, in the step 105, the uneven illuminance and the illumination telecentricity are measured in a state in which the driving amount d2 of the driving unit 24 is set to the end (d2=−d2max) on the minus side in the range capable of driving. Accordingly, the inclination component a3 of the uneven illuminance, the concave/convex component b3, the inclination component (c3, d3) of the illumination telecentricity, and the magnification component e3 are obtained in the same manner as described above. When it is intended to calculate the driving rate more highly accurately, it is desirable that the driving amount of the driving unit 24 is set to four or more to measure the uneven illuminance and the illumination telecentricity.

In the subsequent step 106, the driving rate of the driving unit 24 (first lens system 12) is calculated by using the measured values described above. For example, the inclination components a, which are obtained when the driving amount d2 is set to 0, d2max, and −d2max, are a1, a2, and a3 respectively. Therefore, the driving rate ka2 [%/mm] with respect to the inclination component a is as follows.

$$ka2=[(a2-a1)/d2max-(a3-a1)/(2 \cdot d2max)]/2 \quad (1B)$$

Similarly, the driving rates kb2 [%/mm], kc2 [mrad/mm], kd2 [mrad/mm], and ke2 [mrad/mm] are also calculated with respect to the concave/convex component b of the uneven illuminance, the inclination components c, d of the illumination telecentricity, and the magnification component e of the illumination telecentricity. The driving rates are stored in a storage unit in the main control system 22.

In this process, the dominant value is only the driving rate kb2 with respect to the concave/convex component b of the uneven illuminance. However, even in the case of the other value, those exceeding predetermined levels may be stored as they are. Values within the predetermined levels may be stored as zero.

Specifically, when the first lens system 12 is driven, there is such a possibility that the driving rate ke2 with respect to the magnification component e of the illumination telecentricity having the characteristic of centro-symmetry (axial symmetry) may exceed the predetermined level in the same manner as the concave/convex component b.

The operations ranging from the step 102 to the step 106 are executed for all of the driving units 23 to 25T as described above to calculate the driving rates kai, kbi, kci, kdi, kei (i=1 to 5) which are stored as parameters for each of the illumination conditions in the main control system 22. After that, the routine proceeds from the step 107 to the step 108 to judge whether or not the driving rate is calculated for all of the necessary illumination conditions. If the calculation is not completed, the routine returns to the step 101 to switch the illumination condition and calculate the driving rate. The driving rate has been calculated for all of the illumination conditions. However, this embodiment is not limited thereto. For example, the driving rate may be calculated for a part of all of the illumination conditions. The driving rate may be determined for the remaining illumination conditions, for example, by means of the interpolation calculation on the basis of the driving rates of other illumination conditions.

In this process, in the case of the second driving unit 24 (first lens system 12), the driving rates ka2, kc2, kd2 concerning the centro-asymmetrical components are amounts of such extents that they are originally negligible. If such a driving rate is large to be not less than a certain value, there is such a possibility that the first lens system 12 is eccentric or inclined. At this stage, it is possible to sense such an inconvenience. Based on this result, it is possible to perform the adjustment.

Next, explanation will be made with reference to a flow chart shown in FIG. 9 for an example of the sequence to automatically adjust the illumination optical system by using the driving rates determined as described above.

Figure 9:
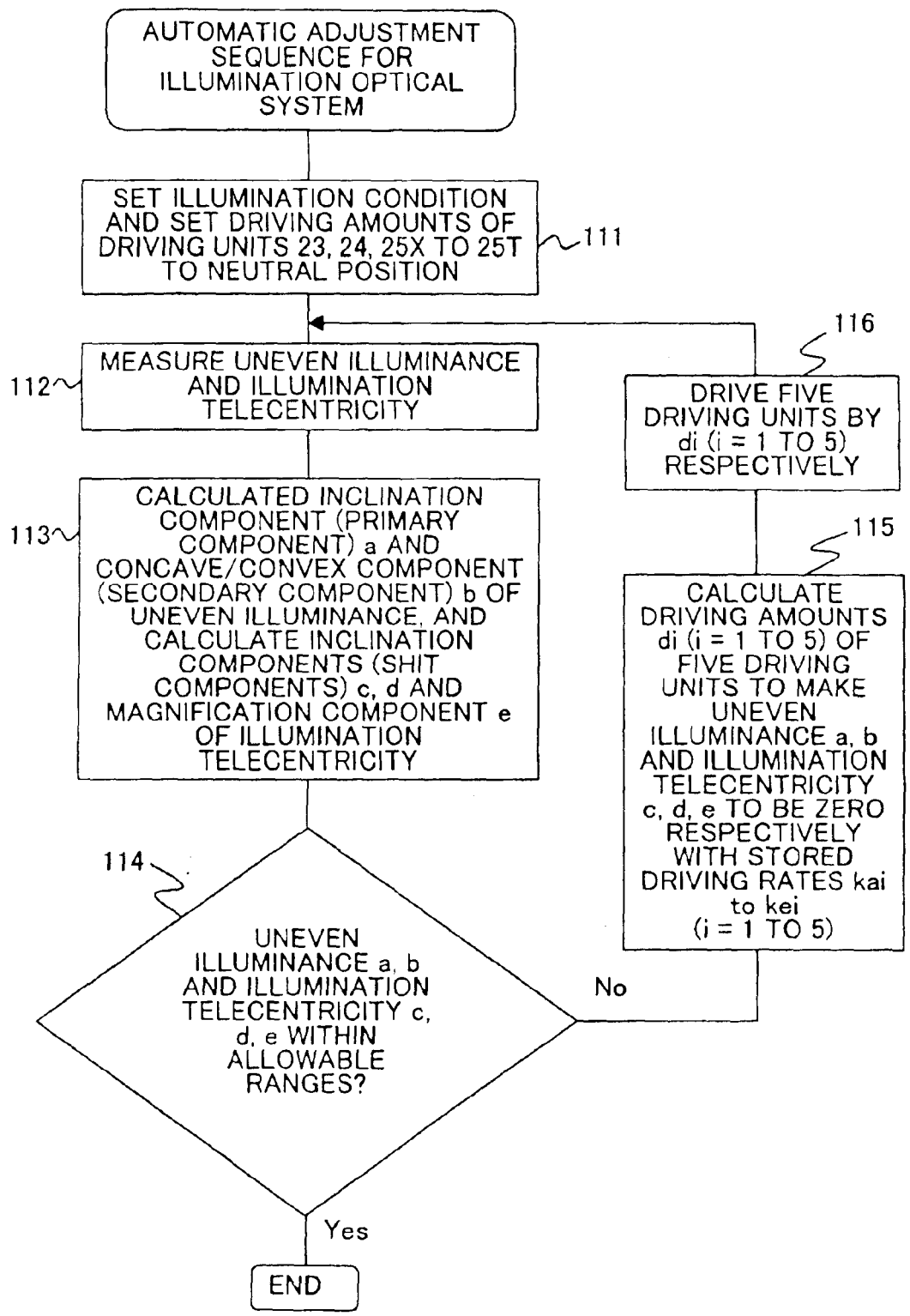
FIG. 9 shows a flow chart illustrating an example of an automatic adjustment sequence for the illumination optical system.

At first, in the step 111 shown in FIG. 9, the illumination condition is selected by the aid of the aperture diaphragm plate 10 shown in FIG. 1. The driving amounts of all of the driving units 23, 24, 25X to 25T are set to the neutral position. The corresponding optical member is set to the optical origin. In the next step 112, the uneven illuminance and the illumination telecentricity are measured in the same manner as in the step 103 shown in FIG. 8. In the step 113, the inclination component (primary component) a and the concave/convex component (secondary component) b of the uneven illuminance are calculated in accordance with the procedure shown in FIG. 5. Further, the inclination components (shift components) c, d and the magnification component e of the illumination telecentricity are calculated. In the next step 114, it is judged whether or not the uneven illuminance a, b and the illumination telecentricity c, d, e are within allowable ranges respectively. If any one of them is deviated from the allowable range, the routine proceeds to the step 115 to calculate the driving amounts di (i=1 to 5) of the five driving units 23 to 25T to make the uneven illuminance a, b and the illumination telecentricity c, d, e to be zero on calculation with the driving rates kai, kbi, kci, kdi, kei (i=1 to 5) stored in the main control system 22. In this case, the following simultaneous equations may be solved.

$$-a=ka1 \cdot d1+ka2 \cdot d2+ka3 \cdot d3+ka4 \cdot d4+ka5 \cdot d5$$

$$-b=kb1 \cdot d1+kb2 \cdot d2+kb3 \cdot d3+kb4 \cdot d4+kb5 \cdot d5$$

$$-c=kc1 \cdot d1+kc2 \cdot d2+kc3 \cdot d3+kc4 \cdot d4+kc5 \cdot d5$$

$$-d=kd1 \cdot d1+kd2 \cdot d2+kd3 \cdot d3+kd4 \cdot d4+kd5 \cdot d5$$

$$-e=ke1 \cdot d1+ke2 \cdot d2+ke3 \cdot d3+ke4 \cdot d4+ke5 \cdot d5$$

However, actually, the number of those which are not zero of the driving rates is about one or two in each row. Therefore, the simultaneous equations can be solved extremely easily. The calculated driving amounts di (i=1 to 5) are also stored in the storage unit in the main control system 22 as parameters corresponding to each of the plurality of illumination conditions.

Specifically, it is considered that the following relationship is provided. That is, both of the driving unit 24 and the driving unit 23 affect the concave/convex component b of the uneven illuminance and the magnification component e of the illumination telecentricity. Both of the driving unit 25T and the driving unit 25X affect the inclination component a of the uneven illuminance and the inclination component c of the illumination telecentricity. Only the driving unit 25Y affects the inclination component d of the illumination telecentricity.

Subsequently, the routine proceeds to the step 116 to drive the five driving units 23 to 25T in the calculated driving amounts di (i=1 to 5) respectively. After that, the routine proceeds to the steps 112 and 113 to measure the uneven illuminance a, b and the illumination telecentricity c, d, e again. In the step 114, if all of their values are not included in the allowable ranges, the routine proceeds to the step 115 again to execute the calculation. If all of the values are included within the allowable ranges, the automatic adjustment is completed. When the same illumination condition is set next time, the adjustment for the illumination optical system is completed for an extremely short period of time only by driving the driving units 23 to 25T on the basis of the stored driving amounts di.

As described above, in this embodiment, the illumination characteristic can be automatically measured. Therefore, all of the measurement sequence for the driving rate shown in FIG. 8 and the automatic adjustment sequence for the illumination optical system shown in FIG. 9 can be performed in an assist-less manner.

Second Embodiment

Next, explanation will be made for an example of the adjusting method adopted when the modified illumination is performed by installing the aperture diaphragm 10b for the zonal illumination (or the aperture diaphragm 10c for the four-spot illumination) at the light-outgoing plane of the second fly's eye lens 9 as shown in FIG. 6A with the illumination optical system of this embodiment.

In this case, the light amount distribution-converting element 55, which is composed of a diffractive optical element (DOE), is installed in place of the first fly's eye lens 6 shown in FIG. 1. In place of the diffractive optical element, a prism including, for example, a conical prism (axicon for zonal illumination) and a prism of the quadrangular pyramid type (pyramid type) (for four-spot illumination) may be used. In order to adjust the illumination area of the exposure light beam IL with respect to the second fly's eye lens 9 depending on whether the aperture diaphragm to be used is the aperture diaphragm 10b or 10c, the arrangement is made such that the first lens system 7A can be driven in the direction perpendicular to the optical axis by the aid of the driving unit 62, and the second lens system 7B can be driven in the optical axis direction by the aid of the driving unit 58. A zoom optical signal, an optical signal to continuously change the aberration, or an optical signal to distort the cross section of the beam by rotating a cylindrical lens may be used in place of the light-collecting optical system (beam-shaping optical system) composed of the lens systems 7A, 7B.

In the case of the optical system shown in FIG. 6A, it has been confirmed by the present inventors that the uneven illuminance is quickly changed depending on the illumination area used when the second fly's eye lens 9 is locally illuminated. The factor of the change of the uneven illuminance is specifically divided into the following factors.

(1) When the local illumination area is small, the image plane illuminance is increased, because the amount of light passing through the aperture diaphragm is large. However, some of the effective elements of the second fly's eye lens 9 are illuminated in a half-finished manner. This badly affects the uneven illuminance.

(2) When the local illumination area is large, the uneven illuminance is not deteriorated. However, of course, the amount of light shielded by the aperture diaphragm 10b, 10c is increased, and the image plane illuminance is lowered.

(3) When the local illumination area is eccentric, there is such a tendency that the uneven illuminance on the image plane is also lowered on any of the right and left sides (inclination component). This results from the fact that each of the elements of the second fly's eye lens 9 has the finite size. Accordingly, in this embodiment, when the modified illumination is performed with the light amount distribution-converting element 55, a special adjustment sequence is prepared as shown in FIG. 10.

Figure 10:
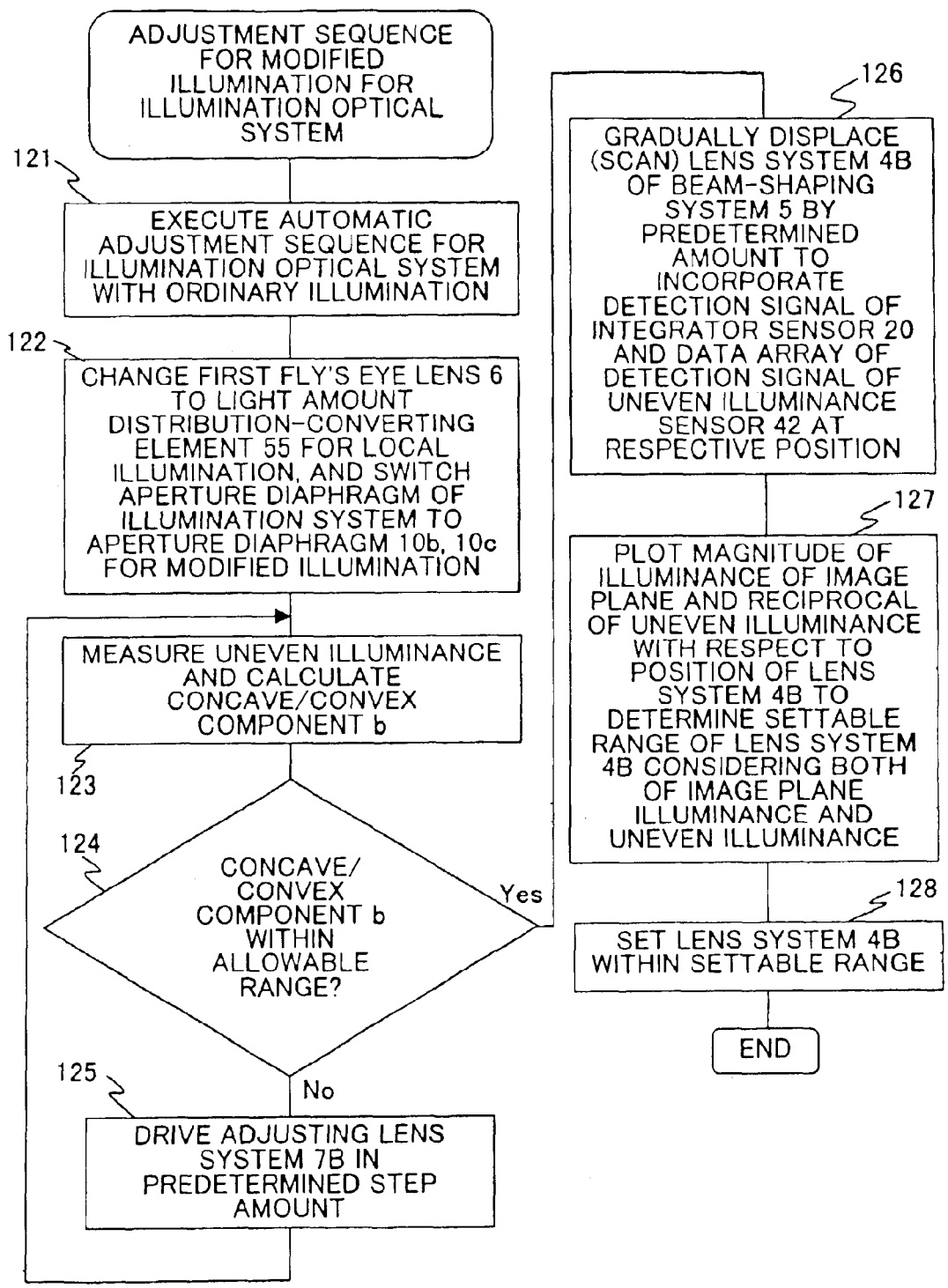
FIG. 10 shows a flow chart illustrating an example of an adjustment sequence for the modified illumination according to a second embodiment.

In the step 121 shown in FIG. 10, the measurement of the driving rate shown in FIG. 8 and the automatic adjustment sequence shown in FIG. 9 are executed in the state shown in FIG. 1, i.e., by setting the ordinary illumination. In the next step 122, as shown in FIG. 6A, the first fly's eye lens 6 is changed to the light amount distribution-converting element 55, and the aperture diaphragm at the light-outgoing plane of the second fly's eye lens 9 is set to the aperture diaphragm 10b or 10c for the modified illumination. In the next step 123, the uneven illuminance is measured by using the uneven illuminance sensor 42 shown in FIG. 1. The inclination component a and the concave/convex component b thereof are calculated as shown in FIG. 4. In this process, if the uneven illuminance having an extreme inclination appears on the both sides of the illuminance distribution in the non-scanning direction, and the inclination component a exceeds the allowable range, then there is such a possibility that the local illumination area is eccentric as described above. In this case, in order to allow the inclination component a to be included within the allowable range, the first lens system 7A is shifted in the direction corresponding to the X direction or the Y direction in the plane perpendicular to the optical axis.

The concave/convex component b of the uneven illuminance is regarded to be the evaluation object in this state. That is, the routine proceeds to the step 124 to judge whether or not the concave/convex component b is within the allowable range. If the concave/convex component b is without the allowable range, the routine proceeds to the step 125 to shift the second lens system 7B in a predetermined step amount in the optical axis direction. After that, the routine returns to the step 123, and the concave/convex component b of the uneven illuminance is measured again to judge whether or not the concave/convex component b is within the allowable range. The correcting operation is executed until the concave/convex component b is included in the allowable range in the step 124.

After the concave/convex component b is included within the allowable range in the step 124, the routine proceeds to the step 126. The lens system 4B of the beam-shaping system 5 shown in FIG. 6A is gradually changed (scanned) by a predetermined amount in the optical axis direction. The uneven illuminance sensor 42 shown in FIG. 1 is scanned in the non-scanning direction at the respective positions (positions u) of the lens system 4B in the exposure area 35P including no pattern image. The data array of the detection signals S2 is incorporated into the exposure control unit 21.

Further, the detection signal S1 of the integrator sensor 20 is also incorporated into the exposure control unit 21.

In the next step 127, the difference ΔIP between the maximum value and the minimum value of the detection signal S2 (illuminance) is determined as the uneven illuminance at the respective positions u of the lens system 4B. The magnitude of the illuminance (average value) IP on the image plane is indirectly determined from the detection signal S1 of the integrator sensor 20. The calculating section in the exposure control unit 21 allows the reciprocal (1/ΔIP) of the uneven illuminance ΔIP and the image plane illuminance IP to correspond to the respective positions u of the lens system 4B. FIG. 7 shows a diagram obtained by plotting the image plane illuminance IP and the reciprocal (1/ΔIP) of the uneven illuminance with respect to the position u for the purpose of better understanding.

In FIG. 7, the horizontal axis represents the position u of the lens system 4B, and the vertical axis represents the image plane illuminance IP and the reciprocal (1/ΔIP) of the uneven illuminance ΔIP. A curve 59 indicates the image plane illuminance IP, and a curve 60 indicates the reciprocal (1/ΔIP) of the uneven illuminance. In this case, when the image plane illuminance IP is increased, then the reciprocal (1/ΔIP) of the uneven illuminance is decreased, and the uneven illuminance is increased. Therefore, it is understood that the image plane illuminance and the uneven illuminance are in the relationship of trade-off. Accordingly, in this embodiment, the range 61 of the position u (u1≦u≦u2), in which the image plane illuminance is not less than the allowable value TL1(position u2) and the reciprocal of the uneven illuminance is not less than the allowable value TL2 (position u1), is determined as the settable range for the lens system 4B, and the range 61 is supplied to the main control system 22.

In the next step 128, the main control system 22 shown in FIG. 1 sets the position u of the lens system 4B shown in FIG. 6A to be within the settable range 61 by the aid of the driving system 26. Accordingly, a high image plane illuminance is obtained to successfully improve the throughput of the exposure step. Further, the uneven illuminance is decreased, and it is possible to obtain a high image formation accuracy.

If any fine and random uneven illuminance is measured on the image plane, when the optical element for the modified illumination is shifted in the optical axis direction, then the random uneven illuminance can be dissolved in some cases. As described above, the various characteristics of the illumination optical system are changed by driving the arbitrary optical member of the illumination optical system. However, when they are selected at the stage of design, and the optimum driving unit is incorporated into the automatic adjustment sequence, then it is possible to further improve the chasing accuracy for the uneven illuminance and the illumination telecentricity.

In the embodiment described above, both of the uneven illuminance and the collapse amount of the telecentricity are measured (detected). However, only any one of them may be measured. Further, as for the collapse amount of the telecentricity, the inclination component is divided into those in the X direction and the Y direction to perform the measurement. However, any one of them may be sufficient in some cases. In the embodiment described above, the uneven illuminance in the non-scanning direction is detected in the scanning exposure apparatus. However, in the case of the static exposure system, it is preferable that the uneven illuminance is detected in the X direction and the Y direction respectively to perform the correction therefor.

In FIG. 6A, the light amount distribution-converting element 55 is arranged in the optical path of the exposure light beam while being exchanged with the first fly's eye lens 6 during the modified illumination. However, for example, the light amount distribution-converting element 55 may be arranged between the exposure light source 1 and the optical integrator (first fly's eye lens 6 in this embodiment). In this case, the light amount distribution-converting element 55 may be exchanged with another element for generating a different light amount distribution, depending on the change of the illumination condition. Further, also in the illustrative arrangement shown in FIG. 6A, the light amount distribution-converting element 55 may be exchanged for those for the zonal illumination and the four-spot illumination.

Third Embodiment

Figure 11:
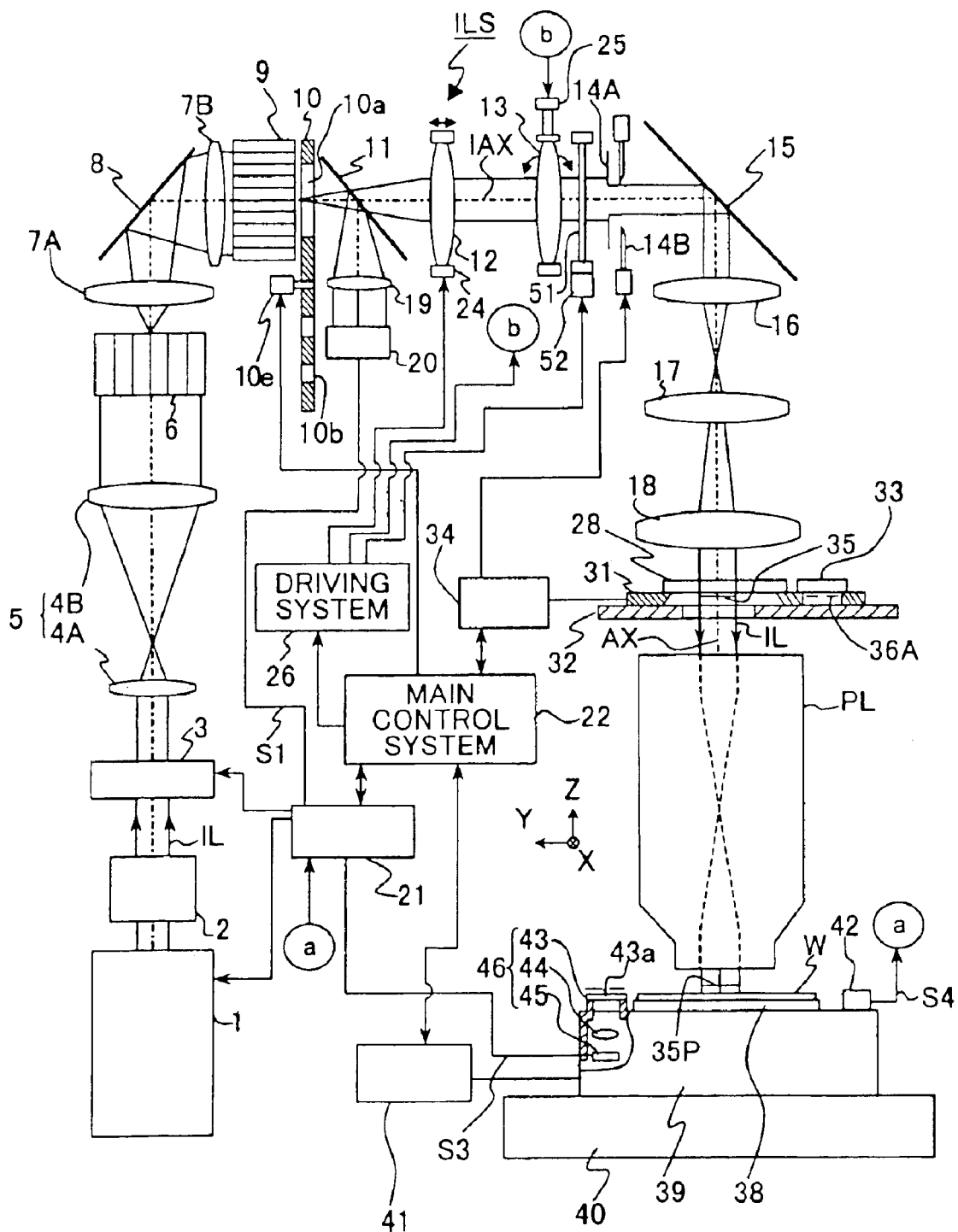
FIG. 11 shows, with partial cutout, an arrangement illustrating a projection exposure apparatus according to a third embodiment of the present invention.

This embodiment is illustrative of a case in which a filter (member) of the present invention is used. FIG. 11 shows a schematic arrangement of a scanning exposure type projection exposure apparatus based on the step-and-scan system of this embodiment. This exposure apparatus has substantially the same structure as that of the exposure apparatus according to the first embodiment except that a concentration filter plate 51 corresponding to a planer area with a variable transmittance distribution is provided, the driving system for the fly's eye lens 9 is not provided, and the structure of the driving system 25 is different from that in the first embodiment.

The concentration filter plate 51 is provided in the illumination optical system ISL. More specifically, the concentration filter plate 51 is arranged at the plane which is further defocused by a predetermined amount from the fixed blind 14A, i.e., at the plane which is slightly defocused from the conjugate plane with respect to the reticle plane. When the concentration filter plate 51 is arranged at the plane which is slightly defocused from the conjugate plane with respect to the reticle plane, any image of foreign matters such as dust or the like adhered to the concentration filter plate 51 can be prevented from transfer onto the wafer W. Alternatively, the image of the concentration filter plate 51 or the foreign matter may be made to be ambiguous in the illumination area 35, i.e., the decrease in illuminance uniformity and consequently the decrease in uniformity of the exposure amount distribution on the wafer W may be avoided, for example, by driving an optical element (for example, at least one of the lens systems 16 to 18 or an unillustrated diffusion plate) arranged between the concentration filter plate 51 and the reticle in place of or in combination of the arrangement of the concentration filter plate 51 at the defocused plane.

The concentration filter plate 51 may be arranged at the plane which is close to the light-outgoing side of the movable blind 14, not on the light-incoming side of the fixed blind 14A. Alternatively, for example, the fixed blind 14A may be arranged at the plane in the vicinity of the pattern plane (reticle plane) of the reticle 28, for example, at the plane close to the upper surface of the reticle 28. The concentration filter plate 51 may be arranged at the plane which is defocused by a predetermined spacing distance on the input side of the movable blind 14B shown in FIG. 11. Accordingly, the concentration filter plate 51 can be easily arranged.

Alternatively, the concentration filter plate 51 may be arranged at the plane which is separated from another conjugate plane with respect to the image plane (i.e., the conjugate plane with respect to the reticle plane) which is different from the plane (conjugate plane with respect to the image plane) at which the movable blind 14B is arranged in the illumination optical system ILS. For example, in FIG. 11, the concentration filter plate 51 may be arranged at the plane in the vicinity of the pattern plane of the reticle 28, for example, at the plane separated by a predetermined spacing distance from the upper surface or the lower surface of the reticle 28, in a state in which the fixed blind 14A is arranged in the vicinity of the movable blind 14B. Further, when the projection optical system PL forms an intermediate image at the inside, the concentration filter plate 51 may be arranged at the plane separated from the plane of the formation of the intermediate image. Further, as for the movable blind 14B, an arrangement is also available, in which the movable blind 14B is arranged, for example, closely to the reticle plane.

Figure 12:
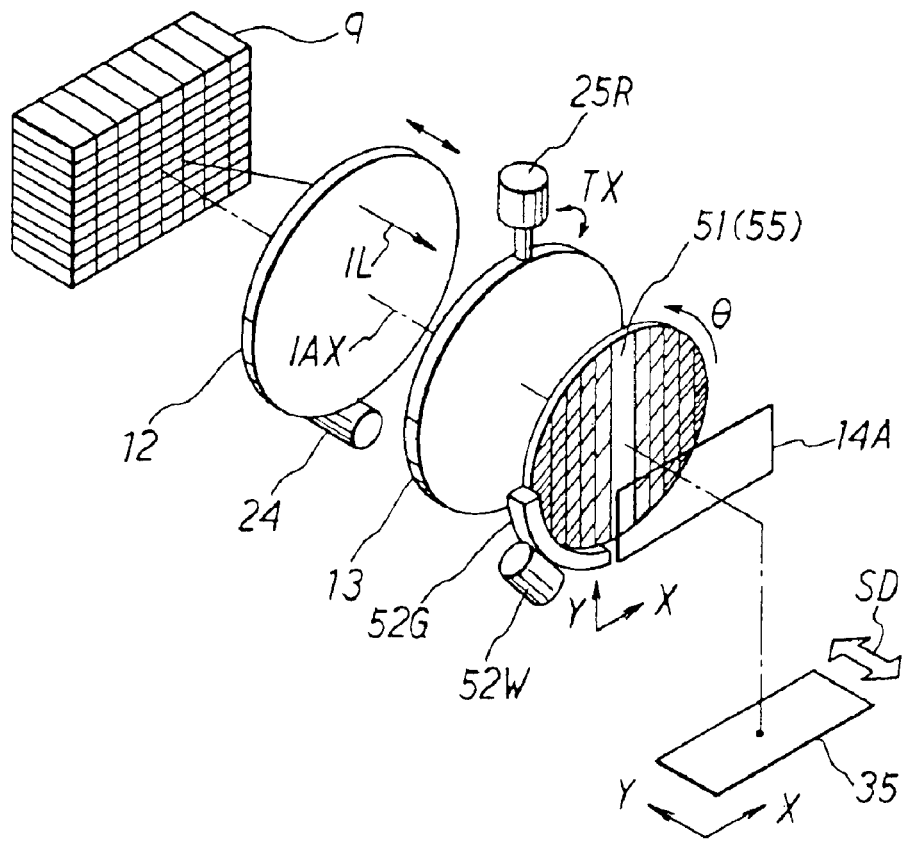
FIG. 12 shows a perspective view illustrating the relationship concerning an illumination area 35 and an optical system ranging from a second fly's eye lens 9 to a fixed blind 14A shown in FIG. 11.

Driving units 24, 25, 52 are installed to the lens systems 12, 13 and the concentration filter plate 51 of this embodiment respectively. FIG. 12 shows a perspective view illustrating the relationship between the illumination area 35 and the optical system ranging from the second fly's eye lens 9 to the fixed blind 14A shown in FIG. 11. In FIG. 12, the scanning direction SD (Y direction) of the reticle with respect to the illumination area 35, and the direction on the fixed blind 14A corresponding to the non-scanning direction (X direction) are designated as the Y direction and the X direction respectively. Only the slit-shaped opening of the fixed blind 14A (fixed field diaphragm) is illustrated in the drawing.

In this arrangement, the driving unit 24 adjusts the position of the first lens system 12 in the direction of the optical axis IAX. The driving unit 25 shown in FIG. 11 is different from that in the first embodiment, which is constructed by a driving unit 25R shown in FIG. 12. The driving unit 25R adjusts the tilt angle (angle of inclination) about the axis which passes through the optical axis IAX of the second lens system 13 and which is parallel to the Y axis, i.e., the tilt angle in the direction corresponding to the non-scanning direction of the illumination area 35. Reference may be made to the arrow TX shown in FIG. 12. Further, the driving unit 52 shown in FIG. 11 includes a gear section 52G which is installed to the periphery of the disk-shaped concentration filter plate 51 shown in FIG. 12 by the aid of an unillustrated ring-shaped holder, and a driving section 52W which includes a gear and a motor for driving and rotating the gear section 52G. The arrangement is made such that the concentration filter plate 51 is rotatable by a desired angle θ within a range of 90° about the center of the optical axis IAX by the aid of the driving unit 52.

Those usable as the driving units 24, 25R include, for example, a driving unit for displacing the holder of the optical element as the driving objective with a driving element such as a micrometer based on the electric system and a piezoelectric element. In this arrangement, an encoder (for example, a rotary encoder) (not shown), which indicates the displacement amount of the optical element in the range capable of driving (driving stroke), is incorporated into each of the driving units 24, 25R and the driving section 52W. Detection signals of the encoders are supplied to the driving system 26 shown in FIG. 11. The driving system 26 controls the states of the lens systems 12, 13 and the concentration filter plate 51 by the aid of the driving units 24, 25, 52 on the basis of the detection signals and the driving information supplied from the main control system 22.

In this arrangement, as having been explained in the first embodiment, the centro-symmetrical unevenness (quadratic function-like unevenness), which is the uneven illuminance axially symmetrical in relation to the optical axis, is corrected by driving the first lens system 12 in the optical axis direction. The inclination unevenness (linear function-like unevenness), which is the uneven illuminance with the illuminance gradually increasing or decreasing in the area intersecting the optical axis, is corrected by controlling the tilt angle of the second lens system 13. The angle of rotation of the concentration filter plate 51 is controlled in order that the uniformity of the exposure amount distribution on the wafer W is finally included in a predetermined allowable range (as described in detail later on). In this embodiment, the centro-symmetrical unevenness can be substantially corrected by controlling the angle of rotation of the concentration filter plate 51. Therefore, the driving unit 24 for the first lens system 12 may be omitted. Accordingly, it is possible to simplify the mechanism of the illumination optical system.

Figure 13A:
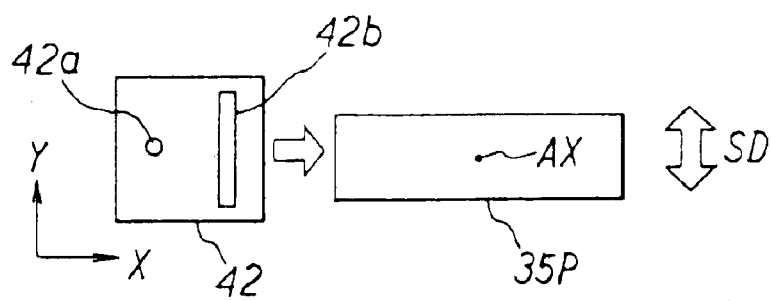
FIG. 13A shows a plan view illustrating an exposure area and an uneven illuminance sensor 42.

An uneven illuminance sensor 42, which serves as the exposure amount distribution-measuring unit, is installed in the vicinity of the wafer holder 38 on the wafer stage 39 of this embodiment. As shown in FIG. 13A, the uneven illuminance sensor 42 is provided with a first sensor which is composed of a photoelectric sensor having a pin hole-shaped light-receiving section 42a, and a line sensor 42b (second sensor) which has one array of photoelectric conversion elements (picture elements or image pixels) arranged in a slender configuration in the scanning direction SD (Y direction). The photoelectric conversion signal of any one of the first sensor and the second sensor is supplied as the detection signal S4 to the exposure control unit 21 shown in FIG. 11 in accordance with the control information supplied from the main control system 22.

With reference to FIG. 13A, the length of the line sensor 42b in the scanning direction SD is set to be wider than the width of the exposure area 35P in the scanning direction SD. When the uneven illuminance in the non-scanning direction (X direction) in the exposure area 35P is measured, the wafer stage 39 shown in FIG. 11 is driven to arrange the line sensor 42b of the uneven illuminance sensor 42 on the side surface of the exposure area 35P in the X direction. The photoelectric conversion signal, which is read by the line sensor 42b, is supplied as the detection signal S4 to the exposure control unit 21. After that, the light emission of the exposure light source 1 is started. The wafer stage 39 is driven to move the line sensor 42b to a plurality of measuring point arranged at predetermined spacing distances in the X direction so that the exposure area 35P is traversed. An added-up signal, which is obtained by adding up the detection signals of the line sensor 42b in the Y direction, is determined by the exposure control unit 21 at the respective measuring points. The added-up signal is supplied to the main control system 22. Actually, the exposure light beam IL involves any dispersion of energy to some extent for each pulse light emission. Therefore, the added-up signal is normalized with the detection signal S1 of the integrator sensor 20 shown in FIG. 11. The main control system 22 stores the normalized added-up signal (referred to as "S4" as well) in the storage unit as corresponding to the position X of the line sensor 42b in the non-scanning direction.

Figure 13B:
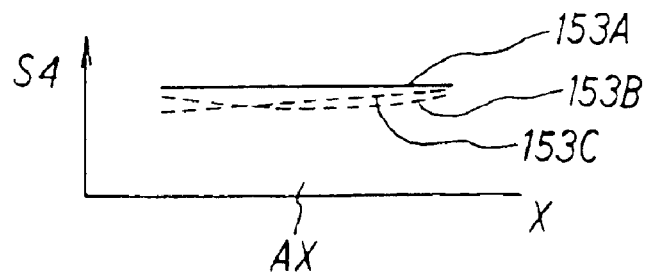
FIG. 13B shows an example of a detection signal obtained by the uneven illuminance sensor 42.

FIG. 13B illustrates an example of the added-up signal S4. In FIG. 13B, the horizontal axis represents the position X of the line sensor 42b in the non-scanning direction, and the vertical axis represents the added-up signal S4. The added-up signal S4 is substantially equal to the exposure amount obtained by adding up the exposure amounts of the exposure area 35P in the scanning direction at the respective measuring points in the non-scanning direction, i.e., the exposure amount (added-up exposure amount) given to the predetermined point on the wafer by the scanning exposure.

Therefore, the added-up signal S4 substantially represents the distribution (exposure amount unevenness) in the non-scanning direction of the exposure amount (added-up exposure amount) after performing the scanning exposure for the respective shot areas on the wafer with the exposure area 35P.

In FIG. 13B, when the added-up signal S4 is flat with respect to the position X as represented by a straight line 153A, it is indicated that there is no unevenness of the exposure amount in the non-scanning direction. In this state, it is possible to obtain high uniformity (high exposure amount accuracy) of the exposure amount distribution. On the other hand, when the added-up signal S4 represents a centrally concave distribution in which it is decreased at a central portion including the optical axis AX as indicated by a curve 153B, it is understood that the exposure amount unevenness which is axially symmetrical in relation to the optical axis, i.e., the axially symmetrical uneven illuminance (centro-symmetrical unevenness) appears. In order to correct the unevenness, for example, the concentration filter plate 51 shown in FIG. 11 may be used to relatively increase the transmittance in the vicinity of the optical axis. Further, when the added-up signal S4 represents the inclination unevenness which gradually increases to traverse the optical axis AX as indicated by a straight line 153C, for example, the tilt angle of the second lens system 13 shown in FIG. 11 may be controlled in order to correct the unevenness. In this embodiment, the unevenness of the exposure amount in the non-scanning direction after the scanning exposure, i.e., the uneven illuminance in the non-scanning direction can be easily measured by using the line sensor 42b as described above. Further, the uneven illuminance in the X direction and Y direction in the exposure area 35P can be also measured by moving the pin hole-shaped light-receiving section 42a shown in FIG. 13A to the plurality of measuring points installed two-dimensionally in the exposure area 35P to measure the illuminances respectively. Further, the exposure amount distribution (exposure amount unevenness) concerning the non-scanning direction can be also obtained in the same manner as in the light-receiving section 42a described above by adding up the illuminances at the respective measuring points concerning the scanning direction (Y direction) at the respective positions in the non-scanning direction (X direction) in the exposure area 35P to determine the added-up light amount (exposure amount) of the exposure light beam IL. In this procedure, the illuminance may be measured at the respective measuring points while stepping the light-receiving section 42a in the scanning direction at the respective positions in the non-scanning direction. However, it is preferable that the light-receiving section 42a is relatively moved in the scanning direction with respect to the exposure area 35P at the respective positions in the non-scanning direction, and the oscillation (oscillation frequency and pulse energy) of the exposure light source 1 and the movement velocity of the wafer stage 39 are controlled under the same condition as that of the scanning exposure for the wafer W. Accordingly, the exposure light beam IL, which as the same number of pulses as that during the scanning exposure, is radiated onto the light-receiving section 42a during the period in which the light-receiving section 42a traverses the exposure area 35P. The added-up light amount (exposure amount) of the exposure light beam IL can be correctly measured at the respective positions in the non-scanning direction. Therefore, although the uneven illuminance sensor 42 has the light-receiving sections 42a, 42b in this embodiment, the uneven illuminance sensor 42 may be provided with only one of the light-receiving sections 42a, 42b. As for the light-receiving section 42b described above, the number of the light-receiving elements (arrays) arranged in the exposure area 35P when the added-up light amount (exposure amount) of the exposure light beam IL is measured at the respective positions in the non-scanning direction may be the same as the number of the pulses radiated onto the respective points on the wafer when the scanning exposure is performed. In this case, for example, it is preferable that the same number of the exposure light beams IL as those used during the scanning exposure are radiated, and the outputs of the light-receiving elements different for each of the pulses are added up to determine the added-up light amount.

The exposure light beam IL of this embodiment is a substantially vacuum ultraviolet ray (VUV) having a wavelength of not more than 200 nm. The light beam is greatly absorbed by light-absorbing substances such as steam and carbon dioxide. The absorption by oxygen is gradually increased. Accordingly, the purge gas, which is a gas from which such light-absorbing substances are removed, and organic matters and fine dust or the like are removed by using, for example, a chemical filter or an HEPA filter (high efficiency particulate air-filter), is supplied to the optical path for the exposure light beam IL ranging from the exposure light source 1 to the wafer W shown in FIG. 11. Those usable as the purge gas include, for example, dry air, nitrogen gas, and helium gas.

Even when the purge gas, from which organic matters or the like are highly removed as described above, is used, a minute amount of remaining organic matters or the like cause the chemical reaction with the exposure light beam IL. Cloudy substances gradually adhere to the surfaces of the respective optical elements in the illumination optical system ILS and the projection optical system PL. As a result, the transmittance distribution is changed, and any uneven illuminance occurs in the exposure area 35P on the wafer W in a time-dependent manner. The uneven illuminance caused by the cloudy substance tends to form the centro-symmetrical unevenness (quadratic function-like unevenness) which is axially symmetrical in relation to the optical axis AX (coincident with the exposure center in this embodiment). Especially, there is such a tendency that the uneven illuminance, in which the illuminance is lowered at the central portion in the vicinity of the optical axis AX (hereinafter referred to as "centrally concave unevenness"), is caused. Accordingly, in this embodiment, the centro-symmetrical unevenness (especially the centrally concave unevenness), which is principally caused in the time-depending manner as described above, is corrected by using the rotatable concentration filter plate 51 shown in FIG. 11.

Figure 14A:
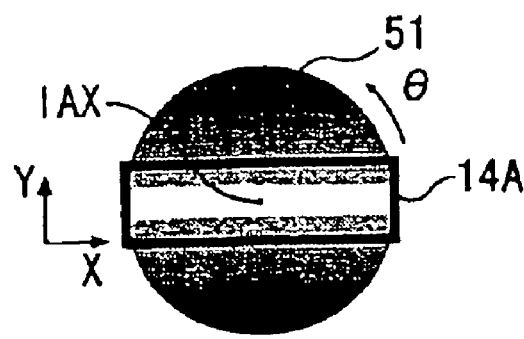
FIGS. 14A–14C show states in which the angle of rotation of a concentration filter plate 51 is changed in three ways in the third embodiment.
Figure 14A:
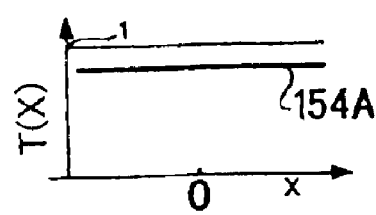

Explanation will be made in detail below for an example of the arrangement and the method of the use of the rotatable concentration filter plate 51. FIG. 14A shows the arrangement of the concentration filter plate 51 shown in FIG. 11 (or FIG. 12) in the initial state. With reference to FIG. 14A, the concentration filter plate 51 is provided with a predetermined light-shielding substance or a dimming substance such as metal (for example, chromium) which is deposited, for example, by means of vapor deposition on a first surface of a flat disk-shaped glass substrate which transmits the exposure light beam so that a predetermined one-dimensional transmittance distribution T(X) is obtained axially symmetrically in relation to the optical axis IAX. In FIG. 14A, the portion having the denser black color is deposited with a larger amount of the substance, and the transmittance is lowered at the portion in accordance therewith.

In FIG. 14A, the direction of the concentration filter plate 51 to have the transmittance distribution is set to be in the Y direction (scanning direction) with respect to the fixed blind 14A (represented by the slit-shaped opening as in the same manner in the followings). The transmittance T(Y) in the Y direction is represented as follows by using a coefficient a.

$$T(Y)=1/(a \cdot Y^2+1) \tag{2A}$$

This function is determined to offset the quadratic function-like unevenness, resulting from the fact that the centro-symmetrical unevenness ordinary forms the quadratic function-like unevenness. This function is determined in various ways depending on the (expected) amount of generation of the actual centro-symmetrical unevenness. The coefficient a in the expression (2A) is a parameter to determine the maximum correction amount of the concentration filter plate 51. Assuming that R represents the radius of the concentration filter plate 51 and D represents the maximum correction amount for the transmittance at the outermost periphery of the concentration filter plate 51, the coefficient a is represented as follows. The maximum correction amount D is, for example, 0.1 (10%).

$$a=D/\{(1-D)R^2\} \tag{2B}$$

In this embodiment, it is assumed that the uneven illuminance, which is caused by the cloudy substance gradually adhered to the optical element in the optical system, is successfully corrected by one sheet of the concentration filter plate 51, even when the projection exposure apparatus shown in FIG. 11 is operated in the actual exposure step for not less than about two years. If the degree of the centro-symmetrical unevenness in the exposure area 35P, especially the centrally concave unevenness, which is caused after using the projection exposure apparatus for two years, is about 10% in range, the value of the coefficient a in the expression (2B) is as follows.

$$a=0.1/(0.9 \cdot R^2) \tag{2C}$$

Figure 14B:
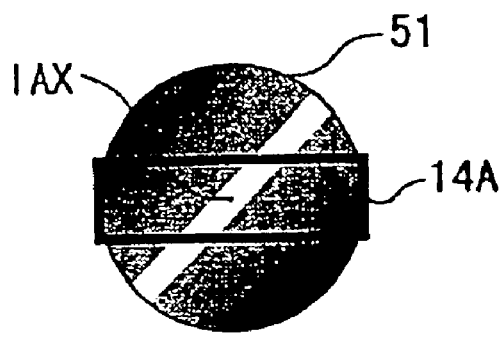
Figure 14B:
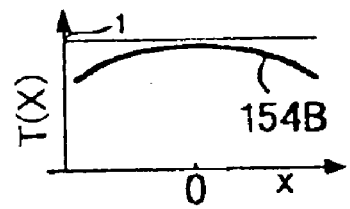
Figure 14C:
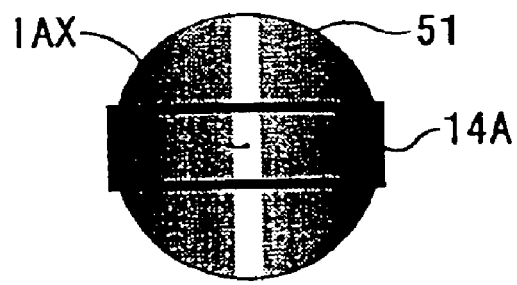
Figure 14C:
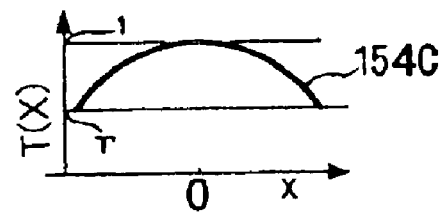
Figure 17A:
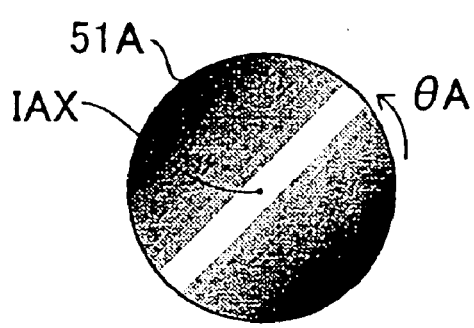
FIG. 17A shows a concentration filter plate 51A of the fourth embodiment.
Figure 17C:
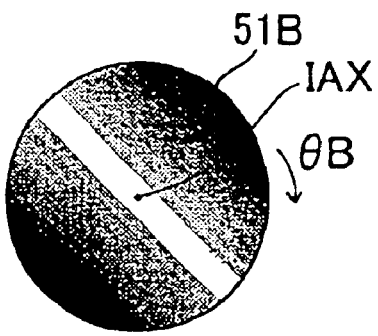
FIG. 17C shows a second concentration filter plate 51B of the second embodiment.
Figure 17B:
FIG. 17B shows a transmittance distribution of the concentration filter plate 51A.
Figure 17D:
FIG. 17D shows a transmittance distribution of the concentration filter plate 51B.
Figure 17E:
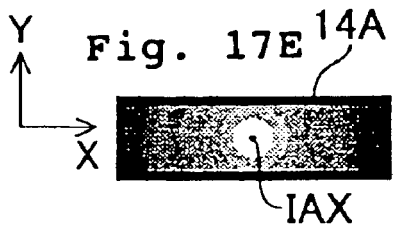
FIG. 17E shows a final transmittance distribution.

As shown in FIGS. 14A to 14C, the concentration filter plate 51 is rotatable by an arbitrary angle θ within a range of 90° about the center of the optical axis IAX.

FIG. 14A shows a state in which the concentration filter plate 51 is not rotated, i.e., the angle θ is 0°. In this state, the average transmittance T(X) in the non-scanning direction (X direction) in the opening of the fixed blind 14A is flat as indicated by a straight line 154A. The function to adjust the uneven illuminance in the non-scanning direction is not operated. In the following drawings, it is assumed that the X coordinate at the optical axis IAX is 0. The transmittance distribution is high at the central portion with respect to the scanning direction (Y direction). The uneven illuminance caused thereby is averaged by means of the scanning exposure.

On the other hand, FIG. 14C illustrates a case in which the concentration filter plate 51 is rotated by 90°, in order to correct the centrally concave unevenness extremely advanced by the time-dependent change. In this case, the transmittance T(X) in the non-scanning direction is as follows.

$$T(X)=1/(a \cdot X^2+1) \tag{3}$$

In this case, the difference between the maximum value and the minimum value is maximized as indicated by a curve 154C for the distribution of the transmittance T(X). The effect of correcting the centrally concave unevenness by the concentration filter plate 51 is maximized. The value T' of the minimum value of the curve 154C is 0.9 (90%) according to the expression (2B).

FIG. 14B shows a state in which the concentration filter plate 51 is rotated by 45° (θ=45°). In this case, the transmittance T (X, Y, θ) corresponding to each of the points in the opening of the fixed blind 14A (corresponding to the exposure area 35P on the wafer) is as follows.

$$T(X,Y,\theta)=1/\{a(X \sin \theta - Y \cos \theta)^2+1\} \tag{4}$$

The transmittance T(X) in the non-scanning direction, which is obtained by averaging the transmittance in the Y direction, is represented by a curve 154B. Accordingly, it is understood that the correcting is effect is obtained for the centrally concave unevenness of an intermediate degree between those of θ=90° and θ=0°.

As shown in FIGS. 14A to 14C, the average transmittance distribution in the non-scanning direction can be regulated to have an arbitrary characteristic by rotating the concentration filter plate 51 to have an arbitrary angle. It is possible to successively correct the centrally concave unevenness caused by the variation of radiation in the time-dependent manner. Further, the concentration filter plate 51 is a thin flat plate which is installed in the vicinity of the conjugate plane with respect to the image plane. Therefore, the uniformity of the coherence factor (σ value) of the illumination optical system is scarcely affected when the uneven illuminance is corrected. That is, on condition that the uniformity of the σ value is previously adjusted to be within a predetermined allowable range in the initial state, the uniformity of the σ value is not deteriorated even when the uneven illuminance due to the time-dependent change is corrected. Thus, it is possible to always obtain high line width uniformity.

The mechanism for rotating the concentration filter plate 51 is based on the electric system (automatic control system). Therefore, for example, the uneven exposure amount (uneven illuminance) in the non-scanning direction may be measured as shown in FIG. 13 by using the uneven illuminance sensor 42 during the periodic maintenance, and the concentration filter plate 51 can be driven and rotated at an optimum angle to offset the uneven exposure amount in situ. Further, the degree of the centrally concave unevenness may be determined by approximate calculation at an arbitrary period of elapse time by temporally managing the projection exposure apparatus for a long period of time, or managing the total radiation amount. The concentration filter plate 51 can be also rotated automatically (in real time) so that the centrally concave unevenness is corrected.

Further, the correction can be also made for the difference between a plurality of illumination conditions concerning the uneven illuminance initially generated. The concentration filter plate 51 of this embodiment has only the function to make the centrally concave unevenness to be flat. However, for example, a fixed concentration filter plate or the like may be previously inserted in the vicinity of the concentration filter plate 51 shown in FIG. 12. The uneven illuminance under all of the illumination conditions may be made to slight centrally concave unevenness. The difference may be corrected by rotating the concentration filter plate 51. Accordingly, it is possible to suppress the occurrence of the uneven illuminance even when the illumination condition is switched between the ordinary illumination and the modified illumination. The concentration filter plate 51 of this embodiment can be electrically controlled. Therefore, the concentration filter plate 51 may be rotated up to an optimum angle every time when the illumination condition is switched. Slight illumination loss initially appears in all cases. However, actually, it is possible to suppress the illumination loss to be not more than about 5%.

The concentration filter plate 51 can be produced in accordance with a variety of production methods as shown in FIG. 15. In the concentration filter plate 51 shown in FIG. 15A, the transmittance distribution, which is continuously changed in the Y direction, is obtained by vapor-depositing a dimming substance such as chromium (Cr) on a light-transmissive substrate while continuously changing the film thickness. The metal such as chromium behaves as a light-shielding substance in the case of an ordinary film thickness. However, in this embodiment, chromium or the like is used as the dimming substance in a region of the film thickness in which the light is transmitted to some extent. In the concentration filter plate 51G shown in FIG. 15B, a first surface of a substrate is divided into a plurality of band-shaped areas in the Y direction, and a dielectric multilayered film is formed in the band-shaped areas so that predetermined transmittances are obtained respectively. That is, in the concentration filter plate 51G, the transmittance distribution is changed in a stepwise manner in the Y direction. However, the number of division is increased to be not less than about 10, it is possible to obtain the correcting effect for the uneven illuminance which is substantially equivalent to that obtained by the continuously changing transmittance distribution.

On the other hand, in the concentration filter plate 51D shown in FIG. 15C, a large number of light-shielding fine dot patterns composed of, for example, chromium, are deposited in the Y direction on a substrate in a ratio of existence so that a predetermined transmittance distribution (macroscopic concentration distribution) is obtained as a whole. Even when the concentration filter plate 51D is used, it is possible to correct the uneven illuminance in the same manner as in the case shown in FIG. 15A. The concentration filter plate 51D is also installed at the position slightly defocused from the conjugate plane with respect to the image plane. Because of the formation with a random distribution in partial areas respectively, the dot pattern is not transferred onto the image plane. The random dot pattern is, for example, a fine circular pattern having a diameter of about 25 μm. Assuming that the maximum correction amount for the centrally concave unevenness is about 10%, the probability of existence of the dot pattern at an arbitrary position in the concentration filter plate 51D is postulated to be included within a range of about 0 to 15%.

Fourth Embodiment

Next, a forth embodiment of the present invention will be explained with reference to FIGS. 16 and 17. In this embodiment, the centro-symmetrical unevenness can be corrected even in a static exposure state, not in a state after performing the scanning exposure. The basic arrangement of the projection exposure apparatus of this embodiment is the same as that shown in FIG. 11. However, this embodiment differs in that two concentration filter plates, which are rotatable respectively, are installed in place of the single concentration filter plate 51 shown in FIG. 11. In FIG. 16, components or parts corresponding to those shown in FIG. 12 are designated by the same reference numerals, detailed explanation of which will be omitted.

FIG. 16 shows a relationship between the slit-shaped illumination area 35 and the optical system ranging from the fly's eye lens 9 to the fixed blind 14A of the projection exposure apparatus of this embodiment. In FIG. 16, a first concentration filter plate 51A and a second concentration filter plate 51B are adjacently arranged rotatably about the optical axis IAX at the position slightly defocused toward the second lens system 13 from the plane slightly defocused from the arrangement plane of the fixed blind 14A, i.e., the conjugate plane with respect to the reticle plane (conjugate plane with respect to the image plane). One-dimensional transmittance distribution, which has the same characteristic as that of the concentration filter plate 51 shown in FIG. 11 and which is axially symmetrical in relation to the optical axis, is formed on each of the two concentration filter plates 51A, 51B.

The concentration filter plate 51A is driven and rotated by an angle θA within a range of 90° counterclockwise about the center of the optical axis IAX by the aid of a driving section 52WA and a gear section 52GA installed to the periphery of the first concentration filter plate 51A. On the other hand, the concentration filter plate 51B is driven and rotated by an angle θB within a range of 90° clockwise about the center of the optical axis IAX by the aid of a driving section 52WB and a gear section 52GB installed to the periphery of the second concentration filter plate 51B. Further, in the initial state of this embodiment, the angles of rotation of the two concentration filter plates 51A, 51B are set so that the average transmittance distribution in the non-scanning direction is flat in the same manner as in the concentration filter plate 51 shown in FIG. 14A.

When the centro-symmetrical unevenness (especially the centrally concave unevenness) is corrected, the two concentration filter plates 51A, 51B are driven by an identical angle of rotation in opposite phases, i.e., by an identical angle of rotation in opposite directions. Accordingly, the transmittance distribution can be corrected with an axially symmetrical two-dimensional distribution about the center of the optical axis IAX. Therefore, it is possible to obtain a uniform illuminance distribution over the entire surface of the illumination area 35 (and consequently the exposure area 35P) in the static state. Further, the uniformity of the σ value of the illumination optical system is not deteriorated.

FIG. 17 shows a state in which the concentration filter plates 51A, 51B are rotated in the opposite phases as described above. In FIG. 17A, the concentration filter plate 51A is rotated counterclockwise by 45° (θA=45°). In FIG. 17B, the concentration filter plate 51B is rotated clockwise by 45° (θB=45°). In this case, the transmittance distributions in the opening of the fixed blind 14A, which are brought about by the concentration filter plates 51A, 51B, are those shown in FIGS. 17B and 17D respectively. Actually, the transmittance distribution in the opening of the fixed blind 14A is concentric about the center of the optical axis IAX as shown in FIG. 17E. That is, the bright and dark areas in FIGS. 17B and 17D are offset to one another. Thus, the ideal centrally symmetrical secondary transmittance distribution is obtained in both of the X direction and Y direction without performing any integration in the scanning direction. When the ordinary centrally concave unevenness is corrected with this transmittance distribution, the uneven illuminance in the static exposure state can be also corrected simultaneously. The two-dimensional uneven illuminance as described above can be measured with the sensor having the pin hole-shaped light-receiving section 42a, of the uneven illuminance sensor 42 shown in FIG. 13A.

Upon the maintenance for the actual projection exposure apparatus of the scanning exposure type, a case also arises, in which the exposure is performed in a static state without performing the scanning. Therefore, the correction of the uneven illuminance in the static state according to this embodiment is effective. The two concentration filter plates 51A, 51B of this embodiment are not limited to the use for the scanning exposure type exposure apparatus, which can be also adopted in order to correct the uneven illuminance in the exposure apparatus of the full field exposure type (static exposure type). That is, the present invention is also applicable to the exposure apparatus of the full field exposure type.

Fifth Embodiment

Next, a fifth embodiment of the present invention will be explained with reference to FIGS. 12 and 18. In this embodiment, the present invention is applied to correct the inclination unevenness (linear function-like unevenness) in which the illuminance is gradually increased or decreased so that the optical axis is traversed in the non-scanning direction. The inclination unevenness is not changed in a time-dependent manner by the cloudiness of the optical element of the illumination optical system or the like. It is unnecessary to provide an extremely wide correction range as well. However, the inclination unevenness is an amount to be corrected, for example, upon the start-up after the assembling and the adjustment of the projection exposure apparatus.

In the projection exposure apparatus shown in FIG. 11, the inclination unevenness is corrected by controlling the tilt angle of the second lens system 13. However, it is feared that the uniformity of the σ value of the illumination optical system is deteriorated during this process. In order to avoid such an inconvenience, in this embodiment, the concentration filter plate 51 shown in FIG. 12 is exchanged with a concentration filter plate 155 for correcting the inclination unevenness. The concentration filter plate 155 for correcting the inclination unevenness may be arranged closely to the concentration filter plate 51 for correcting the centro-symmetrical unevenness. A rotary driving unit (52G, 52W) for the concentration filter plate 155 for correcting the inclination unevenness has such a function that the concentration filter plate 155 is rotated by an arbitrary angle θ within a range of ±90° (180° in range) about the center of the optical axis IAX.

Figure 18A:
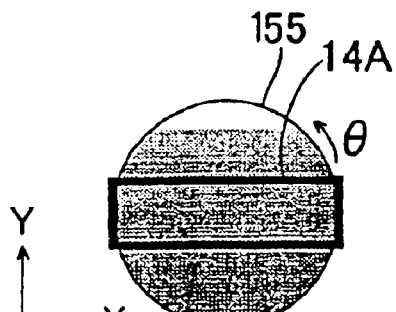
FIGS. 18A–18C show states in which the angle of rotation of a concentration filter plate 155 according to a fifth embodiment of the present invention is changed in three ways.
Figure 18B:
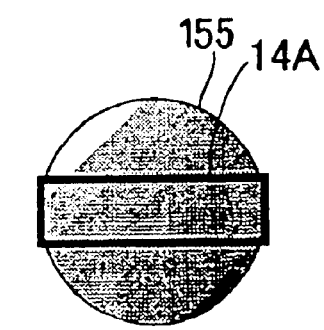

FIG. 18A shows a positional relationship between the fixed blind 14A and the concentration filter plate 155 for correcting the inclination unevenness in the initial state. In FIG. 18A, the transmittance distribution T(X) of the disk-shaped concentration filter plate 155 is set to be a one-dimensional distribution which is gradually increased across the optical axis from the end in the −Y direction to the end in the +Y direction. That is, the transmittance T(Y) of the concentration filter plate 155 in the Y direction is represented by the following expression with a coefficient b. The origin of the Y coordinate is the optical axis, and R represents the radius of the concentration filter plate 155.

$$T(Y) = b \cdot Y + (1 - b \cdot R) \tag{5}$$

The maximum value of the transmittance is 1 (Y=R), and the minimum value is (1−2b·R) (Y=−R). The maximum correction amount is 2b·R. The inclination unevenness is not changed in a time-dependent manner unlike the centro-symmetrical unevenness. It in enough to provide a slight correction amount. The coefficient b has an extremely small value. Accordingly, when the filter plate is not rotated, the illuminance loss is kept within a slight ratio. Therefore, the average transmittance T(X) in the non-scanning direction shown in FIG. 18A is constant at a value which is slightly lowered from 1 (100%) as shown by a straight line 156A. Actually, when the unevenness of the exposure amount in the non-scanning direction measured by using the uneven illuminance sensor 42 shown in FIG. 13 is the inclination unevenness, the inclination unevenness can be corrected by rotating the concentration filter plate 155 so that the inclination unevenness is offset.

Figure 18C:
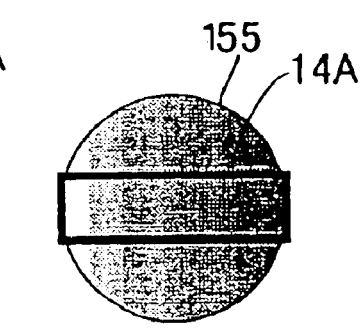
Figure 18C:
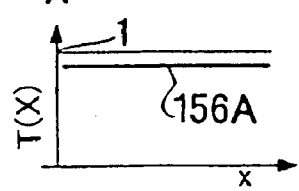
Figure 18C:
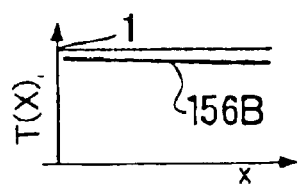
Figure 18C:
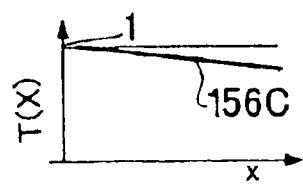

In this embodiment, the maximum correction amount of the inclination unevenness is obtained in the case of θ=90°. FIG. 18C is illustrative of a case of θ=+90°. In this case, the transmittance T(X) in the non-scanning direction is represented by an expression in which Y is substituted with −X in the expression (5) as shown by a straight line 156C (provided that the origin of the coordinate X is the optical axis). In this case, for example, if it is assumed that the inclination unevenness may be generated in ±1% in maximum at the periphery with respect to the position in the vicinity of the optical axis in the optical system of this embodiment, the coefficient b may be set as follows in order to correct the inclination unevenness.

$$b = 0.98/(2 \cdot R) \tag{6}$$

Sixth Embodiment

Next, a sixth embodiment of the present invention will be explained with reference to FIGS. 19 and 20. In this embodiment, the centro-symmetrical unevenness in the static exposure state is corrected without badly affecting the uniformity of the σ value of the illumination optical system by using one concentration filter plate. Also in this embodiment, the projection exposure apparatus shown in FIGS. 11 and 12 is basically used. However, this embodiment differs in that a rotatable concentration filter plate, which has a substantially concentric transmittance distribution, is used in place of the concentration filter plate 51 shown in FIG. 12.

Figure 19A:
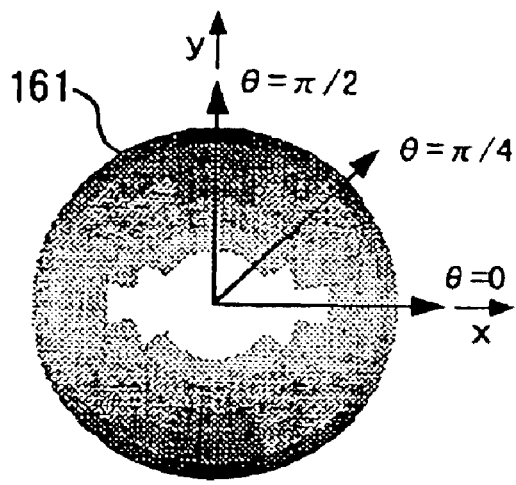
FIG. 19A shows a first concentration filter plate 161 according to a sixth embodiment of the present invention.

FIG. 19A shows the rotatable concentration filter plate 161 for correcting the centrally concave unevenness to be used in this embodiment. In FIG. 19A, the concentration filter plate 161 is formed by deposing a light-shielding substance or a dimming substance with a predetermined substantially concentric transmittance distribution T(r) on a first surface of a light-transmissive circular thin substrate. The center of the concentration filter plate 161 is coincident with the optical axis of the illumination optical system. Explanation will be made assuming that the y axis extends in the direction corresponding to the scanning direction passing through the optical axis, and the x axis extends in the direction corresponding to the non-scanning direction.

In order to explain the transmittance distribution in this embodiment, the transmittance T (r, ϕ) represented by the polar coordinate is expressed as follows by substituting the coefficient a with a function a(ϕ) of the angle ϕ and substituting the position Y with the radius r, in the transmittance T(Y) in the expression (2C). The coefficient a(ϕ) is represented as follows assuming that the maximum correction amount D in the expression (2B) is the function D(ϕ) of the angle ϕ.

$$T(r, \phi) = 1/\{a(\phi) \cdot r^2 + 1\} \tag{11}$$

$$a(\phi) = D(\phi)/\{(1 - D(\phi))R^2\} \tag{12}$$

In this case, the polar coordinate system (ϕ, r) can be converted into the rectangular coordinate system (x, y) by using the following expressions of relations.

$$\phi = \tan^{-1}(y/x) \tag{13}$$

$$r = (x^2 + y^2)^{1/2} \tag{14}$$

Accordingly, the expression (11) is expressed by the rectangular coordinate system (x, y) as follows by using the expressions of relations.

$$T(x,y)=1/\{a(x,y)\cdot(x^2+y^2)+1\} \quad (15)$$

If the coefficient a is determined assuming that "the angular velocity is constant" for the change of the transmittance, $a(\phi)$ in the expression (12) is represented as follows.

$$a(\phi)=\phi\cdot D/\{(\pi/2-\phi\cdot D)R^2\} \quad (16)$$

The transmittance T(x, y, θ) in the rectangular coordinate system (x, y), which is obtained after rotating the concentration filter plate 161 shown in FIG. 19A by the angle θ, is represented as follows.

$$T(x, y, \theta) = \cfrac{1}{\left[\left\{\cfrac{\tan^{-1}\left|\cfrac{y\cos\theta + x\sin\theta}{x\cos\theta - y\sin\theta}\right|\cdot D}{\cfrac{\pi}{2} - \tan^{-1}\left|\cfrac{y\cos\theta + x\sin\theta}{x\cos\theta - y\sin\theta}\right|\cdot D}\right\}\cdot\left\{\cfrac{x^2 + y^2}{R^2}\right\} + 1\right]} \quad (17)$$

According to the expression (17), it is possible to determine the transmittance at an arbitrary position (x, y) at an arbitrary angle of rotation θ.

Figure 19B:
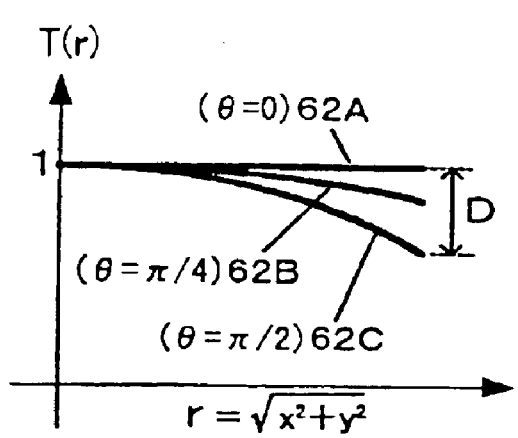
FIG. 19B shows transmittance distributions at a variety of angles of rotation of the concentration filter plate 161.

Specifically, FIG. 19B shows the value T of the transmittance T(x, y, θ) at the position of the radius r in the non-scanning direction from the center (optical axis) when the angle of rotation θ (rad) is set to have three types. In FIG. 19B, a flat straight line 162A represents the transmittance T obtained when the angle of rotation θ is 0. A curve 162B represents the transmittance T obtained when the angle of rotation θ is π/4 (45°). A curve 162C represents the transmittance T obtained when the angle of rotation θ is π/2 (90°). The following facts are appreciated. That is, as the angle of rotation θ approaches π/2, the transmittance T at the peripheral portion decreases in a manner of quadratic function of the radius r. When the angle of rotation θ is π/2, then the amount of decrease of the transmittance at the peripheral portion with respect to the central portion is the maximum correction amount D, and the correction amount with respect to the centrally concave unevenness is maximum.

The concentration filter plate 161 described above is provided to correct the centrally concave unevenness. Similarly, it is also possible to produce a concentration filter plate for correcting the uneven illuminance in which the illuminance is increased at the position in the vicinity of the optical axis in a manner of quadratic function (hereinafter referred to as "centrally convex unevenness"). For this purpose, a transmittance distribution, in which the transmittance distribution of the concentration filter plate 161 is inverted, may be possessed. Further, it is also possible to produce a concentration filter plate capable of correcting both of the centrally concave unevenness and the centrally convex unevenness by changing the angle of rotation of one concentration filter plate.

Figure 20A:
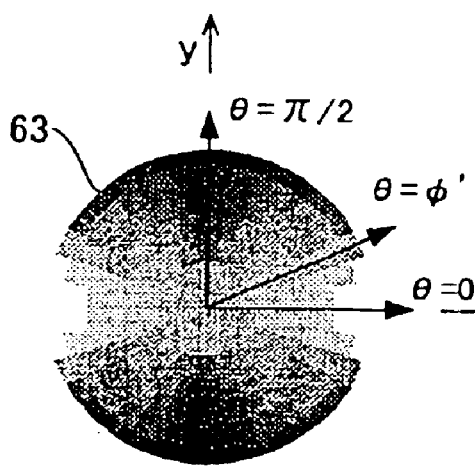
FIG. 20A shows a second concentration filter plate 63 according to the sixth embodiment.

FIG. 20A shows the concentration filter plate 63 which is rotatable and which is capable of correcting both of the centrally concave unevenness and the centrally convex unevenness. In FIG. 20A, the center of the concentration filter plate 63 is coincident with the optical axis of the illumination optical system. Explanation will be made assuming that the x axis and the y axis extend in the directions corresponding to the non-scanning direction and the scanning direction passing through the optical axis respectively.

Also for the concentration filter plate 63, it is assumed that the change of the correction amount of the centrally concave unevenness and the centrally convex unevenness at an arbitrary angle of rotation is proportional to the change of angle. It is assumed that M represents the correction amount for the centrally convex unevenness, and $\phi'$ represents the angle of rotation upon the change from the correction for the centrally convex unevenness to the correction for the centrally concave unevenness. On this assumption, the transmittance T(x, y, $\phi'$) at the coordinate (x, y) when the angle of rotation θ is $\phi'$, and the transmittance T(xmax, ymax, 0) in which the angle of rotation θ is 0 and the coordinate (x, y) is the maximum value (value at the position most separated from the optical axis) (xmax, ymax) are as follows respectively.

$$T(x,y,\phi')=1-M \quad (18A)$$

$$T(xmax,ymax,0)=1 \quad (18B)$$

When these expressions are used, the maximum correction amount D($\phi$), and the maximum correction amount D(x, y, θ) at the angle of rotation θ are as follows.

$$\text{Maximum correction amount } D(\phi) = \frac{M}{1-2M}\left(\frac{\phi}{\phi'} - 1\right) \quad (19)$$

$$D(x, y, \theta) = \frac{M}{1-2M}\left(\frac{1}{\phi'}\left[\tan^{-1}\left|\frac{y\cos\theta + x\sin\theta}{x\cos\theta - y\sin\theta}\right|\right] - 1\right) \quad (20)$$

When the maximum correction amount D(x, y, θ) is used, the transmittance T(x, y, θ) at the angle of rotation θ in the expression (17) is as follows.

$$T(x, y, \theta) = \cfrac{1}{\left[\cfrac{D(x, y, \theta)}{(1-D(x, y, \theta))\cdot R^2}\right](x^2+y^2) + \left(\cfrac{1}{1-M}\right)} \quad (21)$$

According to the expression (21), it is possible to determine the transmittance at an arbitrary position (x, y) at an arbitrary angle of rotation θ.

Figure 20B:
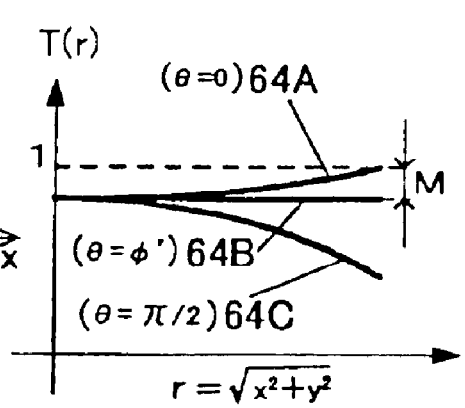
FIG. 20B shows transmittance (T(r)) distributions at a variety of angles of rotation of the concentration filter plate 63.

Specifically, FIG. 20B shows the value T(r) of the transmittance T(x, y, θ) at the position of the radius r in the non-scanning direction from the center (optical axis) when the angle of rotation θ (rad) is set to have three types. In FIG. 20B, an upwardly directed curve 64A represents the transmittance T obtained when the angle of rotation θ is 0. A flat straight line 64B represents the transmittance T obtained when the angle of rotation θ is $\phi'$ (0<$\phi'$<π/2). A downwardly directed curve 64C represents the transmittance T obtained when the angle of rotation θ is π/2 (90°). It is understood that in the range in which the angle of rotation θ is smaller than $\phi'$, the transmittance T is increased in a manner of quadratic function of the radius r, and thus it is possible to correct the centrally convex unevenness, while in the range in which the angle of rotation θ is larger than $\phi'$, the transmittance T is decreased in a manner of quadratic function of the radius r, and thus it is possible to correct the centrally concave unevenness. Further, when the angle of rotation θ is 0, then the amount of increase of the transmittance at the peripheral portion with respect to the central portion is the maximum correction amount M, and the correction amount for the centrally convex unevenness is maximum. When the angle of rotation θ is π/2, the correction amount for the centrally concave unevenness is the maximum correction amount D represented by the following expression.

$$D = \frac{M}{1-2M}\left(\frac{1}{\phi'} \cdot \frac{\pi}{2} - 1\right) \quad (22)$$

In the concentration filter plates 161, 63 shown in FIGS. 19 and 20 of this embodiment, the transmittance distribution is optimized two-dimensionally. Therefore, they are not limited to the use for the projection exposure apparatus of the scanning exposure type. They can be also used for the projection exposure apparatus of the full field exposure type.

In the embodiment described above, for example, the concentration filter plates 51, 161, 63 are used as the filter. In place thereof, for example, a transmission type liquid crystal panel, in which the internal pattern is controllable, may be used, and the internal pattern (transmittance distribution) may be electrically controlled. In the embodiment described above, the adjustment is performed during the measurement of the illumination characteristic (at least one of the illumination telecentricity and the uneven illuminance (exposure amount unevenness)). Alternatively, the illumination characteristic may be adjusted during a period other than the period of the measurement. For example, the change of the illumination characteristic may be calculated (for example, by means of simulation), and the illumination characteristic may be successively adjusted on the basis of the result of the calculation. Alternatively, the illumination characteristic may be periodically measured to perform the adjustment, and the illumination characteristic may be adjusted by means of the calculation as described above during the period of the periodic measurement. As for the uneven illuminance (exposure amount unevenness), both of the inclination unevenness and the centro-symmetrical unevenness (concave/convex unevenness) may be adjusted upon the change of the illumination condition, i.e., the intensity distribution (especially its shape) of the exposure light beam IL on the pupil plane of the illumination optical system. Only the centro-symmetrical unevenness may be adjusted until the change of the illumination condition next time.

In the embodiment described above, the illumination condition-switching system includes all of the aperture diaphragm plate 10, the optical integrator (first fly's eye lens) 6, the light amount distribution-converting element (diffractive optical element) 55, and the switching unit 56. However, the illumination condition-switching system may include only the aperture diaphragm plate 10 or only the switching unit 56. The switching unit 56 may perform only the exchange of the plurality of light amount distribution-converting elements described above. Further, for example, at least one of a zoom optical system and a pair of prisms (conical prism (axicon) or quadrangular pyramid prism) relatively movable in the direction of the optical axis of the illumination optical system may be arranged between the exposure light source 1 and the optical integrator (second fly's eye lens) 9, in combination of at least one of the aperture diaphragm plate 10 and the switching unit 56, or in place of the aperture diaphragm plate 10 and the switching unit 56.

In the embodiment described above, the fly's eye lens 6, 9 is used as the optical integrator. However, it is clear that the present invention is also applicable when an inner surface reflection type integrator (rod integrator) is used as the optical integrator. Further, in the embodiment described above, the illumination optical system ILS based on the so-called double-fly's eye system, in which the two-stage fly's eye lens system 6, 9 is employed, is used. However, the present invention is also applicable when the illumination optical system is adjusted by using only the one-stage optical integrator (for example, fly's eye lens and rod integrator). Further, the diffractive optical element (DOE) may be used as the optical integrator not only for the modified illumination but also, for example, for the ordinary illumination and the small σ value illumination. Of course, in this case, it is desirable that a plurality of diffractive optical elements are prepared to exchange them depending on the illumination condition. For example, when the inner surface reflection type integrator, in which the light-incoming plane is arranged at the pupil plane of the illumination optical system and the light-outgoing plane is arranged in conjugation with the pattern plane of the reticle 28, is used as the optical integrator 9, and the optical unit, which includes at least one of the plurality of light amount distribution-converting elements (diffractive optical elements), the zoom optical system, and the pair of prisms described above, is arranged between the exposure light source 1 and the optical integrator 9, then the incident angle range of the exposure light beam IL coming into the inner surface reflection type integrator is changed upon the change of the illumination condition. When the fly's eye lens is used as the optical integrator 9, a surface light source composed of a plurality of light source images, i.e., a secondary light source is formed on the side of the light-outgoing plane. When the inner surface reflection type integrator is used, a secondary light source composed of a plurality of virtual images is formed on the side of the light-incoming plane. Therefore, the change of the illumination condition in each of the embodiments described above is equivalent to the change of the intensity distribution of the exposure light beam IL on the pupil plane of the illumination optical system, and the change of at least one of the size and the shape of the secondary light source formed on the pupil plane of the illumination optical system.

In the embodiment described above, the present invention is applied to the projection exposure apparatus based on the scanning exposure system. However, the present invention is also applicable to the projection exposure apparatus (stepper) based on the step-and-repeat system (full field exposure system), and the exposure apparatus based on, for example, the proximity system in which the projection system is not used. The exposure light beam (exposure beam) is not limited to the ultraviolet light as described above. For example, the EUV light beam in the soft X-ray region (wavelength: 5 to 50 nm) generated from the SOR (Synchrotron Orbital Radiation) ring or the laser plasma light source may be used. In the EUV exposure apparatus, each of the illumination optical system and the projection optical system is constructed by only a plurality of reflection optical elements. In this case, the concentration filter 51 may be composed of a reflecting member.

A semiconductor device can be produced from the wafer W shown in FIG. 1. The semiconductor device is produced by performing, for example, a step of designing the function and the performance of the device, a step of producing a reticle based on the foregoing step, a step of manufacturing the wafer from a silicon material, a step of exposing the wafer with a pattern on the reticle by using the projection exposure apparatus of the embodiment described above, a step of assembling the device (including a dicing step, a bonding step, and a packaging step), and an inspection step.

The way of use of the exposure apparatus is not limited to the exposure apparatus for producing the semiconductor element. The present invention is also widely applicable, for example, to the exposure apparatus for the liquid crystal display element formed on an angular glass plate or for the display device such as the plasma display, and the exposure apparatus for producing various devices including, for example, the image pickup element (for example, CCD), the micromachine, and the thin film magnetic head. Further, the present invention is also applicable to the exposure step (exposure apparatus) to be used when the mask (for example, photomask and reticle) formed with the mask pattern of various devices is produced by using the photolithography step.

It should be understood that the present invention is not limited to the embodiments described above, which includes a variety of modifications and improvements of the embodiments described above conceived by those skilled in the art within a range not deviated from the scope and the spirit of the present invention. For example, the shape of the concentration filter plate is not limited to the circular configuration, which may be an arbitrary configuration such as a rectangular configuration. An arbitrary dimming material may be used as the material for constructing the concentration filter plate. In order to control the transmittance distribution, the concentration filter plate is not necessarily rotated in the plane. The concentration filter plate may be rotated or moved three-dimensionally. The embodiment described above is illustrative of the case in which the filter of the present invention is provided in the vicinity of the plane conjugate with the exposure plane of the wafer corresponding to the second object. However, there is no limitation thereto. The filter may be provided in the vicinity of the exposure plane of the wafer corresponding to the second object, for example, in the space between the wafer and the projection optical system. Further, with respect to reticles (mask), not only a transmittal type of reticle through which an exposure light beam transmits, but another reflective type of reticle on which the exposure light beam is reflected may be used in this invention.

According to the present invention, the illumination system (illumination optical system) of the exposure apparatus can be adjusted correctly for a short period of time. When the characteristic-measuring system for measuring the illumination characteristic of the illumination system is provided, the illumination system having a plurality of illumination conditions can be adjusted automatically.

When the inclination component and the magnification component of the collapse amount of the telecentric property of the exposure light beam are measured in a divided manner as the illumination characteristic, the adjustment can be correctly performed for a short period of time by independently adjusting the both.

According to the present invention, the transmittance distribution of the planer area or the flat plate-shaped filter is controlled. Accordingly, an advantage is obtained such that the uniformity of the exposure amount distribution can be improved without substantially deteriorating the uniformity of the coherence factor of the exposure light beam. The centro-symmetrical unevenness or the inclination unevenness can be corrected after the scanning exposure by using the one filter which is rotatable and which has the one-dimensional transmittance distribution.

Further, various types of the centro-symmetrical unevenness can be corrected even in the static exposure state by using the two filter having the one-dimensional transmittance distribution in combination, or by using the one filter having the concentric transmittance distribution. Further, according to the method for producing the device of the present invention, the device can be produced with a high line width control accuracy by using the exposure method of the present invention.

What is claimed is:

1. An exposure apparatus which exposes a photosensitive layer on an object with a light via a mask having a pattern, to transfer the pattern onto the photosensitive layer, comprising:
    an optical system having a plurality of optical elements which are provided along an optical axis substantially perpendicular to a plane on which the pattern is placed, and which include an optical integrator from which the mask is illuminated with the light through a part of the plurality of optical elements; and
    a filter device having a filter element rotatably provided between the optical integrator and the plane, and which has a transmittance distribution in a predetermined area;
    wherein the light from the optical integrator passes through a portion in the predetermined area on the filter element, and the light from the filter element has an intensity distribution different from an intensity distribution of the light incident on the filter element from the optical integrator, and the intensity distribution of the light from the filter element is variable by rotating the filter element to change a rotational relationship between the transmittance distribution and the incident light from the optical integrator.

2. The exposure apparatus according to claim 1, wherein the optical system includes an illumination system having the optical integrator and the part of the plurality of optical elements, and the filter element is provided in the illumination system.

3. The exposure apparatus according to claim 2, wherein the filter element is arranged in the illumination system on a conjugate plane which is conjugate with the plane on which the pattern is placed or in the vicinity of the plane.

4. The exposure apparatus according to claim 3, wherein the illumination system includes at least one movable optical element other than the filter element to adjust an illuminance distribution of the light on the plane.

5. The exposure apparatus according to claim 2, wherein the transmittance distribution has a transmittance which varies in a radial direction in a filter plane in which the filter element rotates.

6. The exposure apparatus according to claim 2, wherein the illumination system includes a shaping optical system on an upstream side of the optical integrator;
    the shaping optical system changes an intensity distribution of the light on a pupil plane of the illumination system; and
    the rotational relationship is changed by rotating the filter element prior to an exposure with the light of which the intensity distribution has been changed.

7. The exposure apparatus according to claim 2, wherein the filter device includes filter elements each of which is rotatable, and the intensity distribution of the light from the filter elements is variable by at least one rotation of the filter elements.

8. An exposure apparatus which exposes a photosensitive layer on an object with a light via a mask having a pattern to be transferred onto the photosensitive layer, comprising:
    an optical system having a plurality of optical elements which are provided along an optical axis substantially perpendicular to a plane on which the pattern is placed, and which include an optical integrator from which the mask is illuminated with the light through a part of the plurality of optical elements; and
    a filter device having a filter element rotatably provided in the optical system, the filter element having a transmittance distribution in a predetermined area, the transmittance distribution having a transmittance which varies in a radial direction in a filter plane in which the filter element rotates;

wherein the light passes through a portion in the predetermined area on the filter element, and the light from the filter element has an intensity distribution that is variable by rotating the filter element to change a rotational relationship between the transmittance distribution and the light.

9. The exposure apparatus according to claim 8, wherein the optical system includes an illumination system having a shaping optical system on an upstream side of the optical integrator;

the shaping optical system changes an intensity distribution of the light on a pupil plane of the illumination system; and the rotational relationship is changed, prior to an exposure with the light of which the intensity distribution has been changed, by rotating the filter element.

10. The exposure apparatus according to claim 8, wherein the filter device includes filter elements each of which is rotatable, and the intensity distribution of the light from the filter elements is variable by at least one rotation of the filter elements.

11. An illumination apparatus provided in an exposure apparatus which exposes a photosensitive layer on an object with a light via a mask having a pattern to be transferred onto the photosensitive layer, comprising:

an illumination optical system having a plurality of optical elements which are provided along an optical axis substantially perpendicular to a plane on which the pattern is placed, and which include an optical integrator from which the mask is illuminated with the light through a part of the plurality of optical elements; and a filter device having a filter element rotatably provided between the optical integrator and the plane, and which has a transmittance distribution in a predetermined area;

wherein the light from the optical integrator passes through a portion in the predetermined area on the filter element, and the light from the filter element has an intensity distribution different from an intensity distribution of the light incident on the filter element from the optical integrator, and the intensity distribution of the light from the filter element is variable by rotating the filter element to change a rotational relationship between the transmittance distribution and the incident light from the optical integrator.

12. The illumination apparatus according to claim 11, wherein the filter element is arranged in the illumination optical system on a conjugate plane which is conjugate with the plane on which the pattern is placed or in the vicinity of the plane.

13. The illumination apparatus according to claim 12, wherein the illumination optical system includes at least one movable optical element other than the filter element to adjust an illuminance distribution of the light on the plane.

14. The illumination apparatus according to claim 11, wherein the transmittance distribution has a transmittance which varies in a radial direction in a filter plane in which the filter element rotates.

15. The illumination apparatus according to claim 11, wherein the illumination optical system includes a shaping optical system on an upstream side of the optical integrator;

the shaping optical system changes an intensity distribution of the light on a pupil plane of the illumination optical system; and the rotational relationship is changed, prior to an exposure with the light of which the intensity distribution has been changed, by rotating the filter element.

16. The illumination apparatus according to claim 11, wherein the filter device includes filter elements each of which is rotatable, and the intensity distribution of the light from the filter elements is variable by at least one rotation of the filter elements.

* * * * *